United States Patent
Tanaka et al.

(10) Patent No.: US 11,212,074 B2
(45) Date of Patent: Dec. 28, 2021

(54) DATA RECEPTION DEVICE AND DATA TRANSMISSION/RECEPTION DEVICE

(71) Applicant: SONY SEMICONDUCTOR SOLUTIONS CORPORATION, Kanagawa (JP)

(72) Inventors: Tomokazu Tanaka, Kanagawa (JP); Hidekazu Kikuchi, Kanagawa (JP); Hideo Morohashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/643,635

(22) PCT Filed: Jul. 20, 2018

(86) PCT No.: PCT/JP2018/027208
§ 371 (c)(1),
(2) Date: Mar. 2, 2020

(87) PCT Pub. No.: WO2019/049524
PCT Pub. Date: Mar. 14, 2019

(65) Prior Publication Data
US 2020/0213076 A1     Jul. 2, 2020

(30) Foreign Application Priority Data
Sep. 11, 2017  (JP) .............................. JP2017-174289

(51) Int. Cl.
*H04L 7/033*    (2006.01)
*H03L 7/087*    (2006.01)
(Continued)

(52) U.S. Cl.
CPC ............ *H04L 7/0337* (2013.01); *H03L 7/087* (2013.01); *H03L 7/099* (2013.01); *H04N 5/06* (2013.01)

(58) Field of Classification Search
CPC ......... H04L 7/0337; H04L 5/06; H04L 7/033; H04L 25/02; H03L 7/087; H03L 7/099; H03L 7/0891; H04N 5/06
(Continued)

(56) References Cited

U.S. PATENT DOCUMENTS 5,313,492 A    5/1994  Hashimoto et al.
6,686,777 B1   2/2004  Karlquist
(Continued)

FOREIGN PATENT DOCUMENTS

CN    1488947 A    4/2004
CN    102204156 A    9/2011
(Continued)

OTHER PUBLICATIONS

International Search Report and Written Opinion of PCT Application No. PCT/JP2018/027208, dated Oct. 2, 2018, 09 pages of ISRWO.
(Continued)

*Primary Examiner* — Fitwi Y Hailegiorgis
(74) *Attorney, Agent, or Firm* — Chip Law Group

(57) ABSTRACT

A data reception device that can improve communication quality when transmitting/receiving serial data is to be provided. There is provided the data reception device including a signal generation unit that generates, from serial data received, a first signal whose value is inverted at a rising timing of the serial data and a second signal whose value is inverted at a falling timing of the serial data, and a clock
(Continued)

recovery unit that performs clock recovery using the first signal and the second signal generated by the signal generation unit.

5 Claims, 17 Drawing Sheets

(51) Int. Cl.
    *H03L 7/099*     (2006.01)
    *H04N 5/06*     (2006.01)

(58) Field of Classification Search
    USPC .................................................. 375/262, 371
    See application file for complete search history.

(56) References Cited

U.S. PATENT DOCUMENTS

| | | | |
|---|---|---|---|
| 8,664,983 B1* | 3/2014 | Soh | H04L 7/033 |
| | | | 327/141 |
| 2010/0104029 A1 | 4/2010 | Lee et al. | |
| 2011/0025913 A1* | 2/2011 | Sugiyama | H03L 7/0807 |
| | | | 348/500 |
| 2013/0235912 A1 | 9/2013 | Masuda | |
| 2015/0163050 A1* | 6/2015 | Han | H04L 7/04 |
| | | | 375/362 |
| 2016/0127109 A1 | 5/2016 | Shimosakoda | |

FOREIGN PATENT DOCUMENTS

| | | |
|---|---|---|
| CN | 103312344 A | 9/2013 |
| EP | 1408643 A1 | 4/2004 |
| JP | 05-259945 A | 10/1993 |
| JP | 06-090212 A | 3/1994 |
| JP | 2002-044063 A | 2/2002 |
| JP | 2004-135318 A | 4/2004 |
| JP | 2012-507204 A | 3/2012 |
| JP | 2013-187584 A | 9/2013 |
| JP | 2016-092445 A | 5/2016 |
| KR | 10-0813010 B1 | 3/2008 |
| KR | 10-2011-0079760 A | 7/2011 |
| TW | 201018087 A | 5/2010 |
| WO | 2008/056933 A1 | 5/2008 |
| WO | 2010/062531 A1 | 6/2010 |

OTHER PUBLICATIONS

Charles R. Hogge Jr., "A Self Correcting Clock Recovery Circuit", Journal of lightwave Technology, vol. LT-3, No. 6, Dec. 1985, pp. 1312-1314.

Charles R. Hogge, Jr., "A Self Correcting Clock Recovery Circuit," Journal of Lightwave Technology, vol. LT-3, No. 6, Dec. 1995, pp. 1312-1314.

* cited by examiner

DATA RECEPTION DEVICE AND DATA TRANSMISSION/RECEPTION DEVICE

CROSS REFERENCE TO RELATED APPLICATIONS

This application is a U.S. National Phase of International Patent Application No. PCT/JP2018/027208 filed on Jul. 20, 2018, which claims priority benefit of Japanese Patent Application No. JP 2017-174289 filed in the Japan Patent Office on Sep. 11, 2017. Each of the above-referenced applications is hereby incorporated herein by reference in its entirety.

TECHNICAL FIELD

The present disclosure relates to a data reception device and a data transmission/reception device.

BACKGROUND ART

In order to transmit a large volume of data at high speed, serial data communication without a clock signal is widely used. A device that realizes serial data communication includes a device that transmits a signal using a pair of signal lines (see Patent Document 1 and the like, for example). Also, a clock recovery (clock data recovery (CDR)) circuit is widely used for the device that realizes serial data communication (see Non-Patent Document 1 and the like, for example).

CITATION LIST

Patent Document

Patent Document 1: Japanese Patent Application Laid-Open No. 2013-187584

Non-Patent Document

Non-Patent Document 1: Hogge, CP, "A Self Correcting Clock Recovery Circuit", Journal of Lightwave Technology, LT Volume 3, No. 6, December 1985, p. 1312-1314

SUMMARY OF THE INVENTION

Problems to be Solved by the Invention

A data transmission device that transmits serial data and a data reception device that receives serial data are required to improve communication quality by improving operating speeds, reducing power consumption, and the like.

The present disclosure thus proposes new and improved data reception device and data transmission device that can improve communication quality at the time of transmitting/receiving serial data.

Solutions to the Problems

The present disclosure provides a data reception device including: a signal generation unit that generates, from serial data received, a first signal whose value is inverted at a rising timing of the serial data and a second signal whose value is inverted at a falling timing of the serial data; and a clock recovery unit that performs clock recovery using the first signal and the second signal generated by the signal generation unit.

The present disclosure also provides a data transmission/reception device including: a reception circuit that receives a first digital signal from a single transmission path through which the first digital signal and a second digital signal transmitted in an opposite direction to the first digital signal are transmitted; a transmission circuit that transmits the second digital signal; and a filter circuit that attenuates the second digital signal.

Effects of the Invention

As described above, the present disclosure can provide the new and improved data reception device and data transmission/reception device that can improve communication quality.

Note that the effect is not necessarily limited to the above effect, and any effect illustrated in the present specification or another effect that can be perceived from the present specification may be obtained along with or in place of the above effect.

MODE FOR CARRYING OUT THE INVENTION

Figure 1:
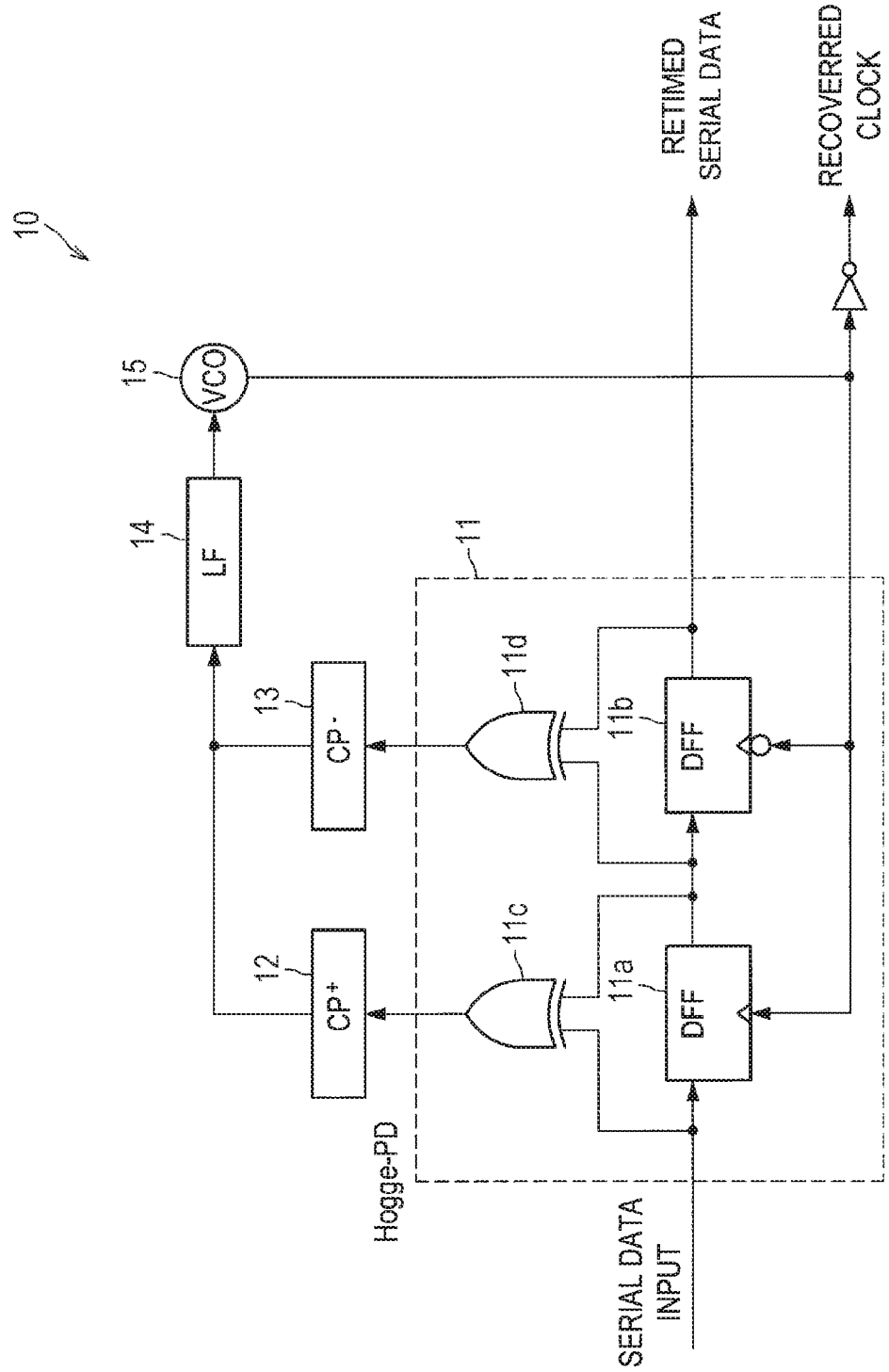
FIG. 1 is an explanatory diagram illustrating an example of a configuration of a typical CDR circuit.

Hereinafter, a preferred embodiment of the present disclosure will be described in detail with reference to the drawings. Note that in the present specification and the drawings, components having substantially the same functional configuration will be assigned the same reference numerals, whereby redundant description will be omitted.

Note that the description will be made in the following order.
1. First embodiment
1.1. Overview
1.2. Configuration example
2. Second embodiment
2.1. Overview
2.2. Configuration example
3. Summary 1. First Embodiment

[1.1. Overview]

Before describing a first embodiment of the present disclosure in detail, an overview leading to the first embodiment of the present disclosure will be described.

In order to transmit a large volume of data at high speed, serial data communication without a clock signal is widely used. A device that realizes serial data communication includes a device that transmits a signal using a pair of signal lines.

A clock recovery (clock data recovery (CDR)) circuit is widely used for a reception device that receives serial data. FIG. 1 is an explanatory diagram illustrating an example of a configuration of a typical CDR circuit. A CDR circuit 10 illustrated in FIG. 1 uses a Hogge phase detector, and includes a Hogge phase detector 11, charge pumps (CP+ and CP−) 12 and 13, a loop filter (LF) 14, and a voltage controlled oscillator (VCO) 15.

The Hogge phase detector 11 includes a first D-type flip-flop (DFF) 11a, a second D-type flip-flop 11b, a first exclusive OR circuit (EXOR) 11c that detects a logical inconsistency between serial data input and output of the first DFF 11a, and a second EXOR 11d that detects a logical inconsistency between the output of the first DFF 11 and output of the second DFF 11b.

Output of the first EXOR 11c drives the charge pump (CP+) 12 that charges a current to the loop filter (LF) 14 as an up signal UP, and output of the second EXOR 11d drives the charge pump (CP−) 13 that discharges a current from the LF 14 as a down signal DOWN.

The LF 14 integrates and smooths a charge pump output current to generate an input signal to the VCO 15. The VCO 15 generates a clock having a frequency corresponding to the input signal. The clock generated by the VCO 15 becomes a recovered clock of the CDR circuit 10 through an inverter 16, and the output of the second DFF 11b becomes retimed data (retimed serial data).

Such a CDR circuit is configured to cause the clock frequency to follow the signal in accordance with a timing fluctuation (jitter) of the input signal. In order to ensure this jitter tolerance, the CDR circuit needs to operate normally even in a case where the clock deviates from a normal position. For this reason, the flip-flop in the first stage at the data entrance of the CDR circuit needs to latch the signal normally even in a case where the clock is out of the normal position (for example, the center position of the signal). Therefore, the flip-flop of the CDR circuit is required to operate normally even at a setup/hold timing that is incomparably smaller than a 1-bit period of the signal received, whereby the characteristics of the flip-flop restrict the performance of the entire reception device.

Figure 2:
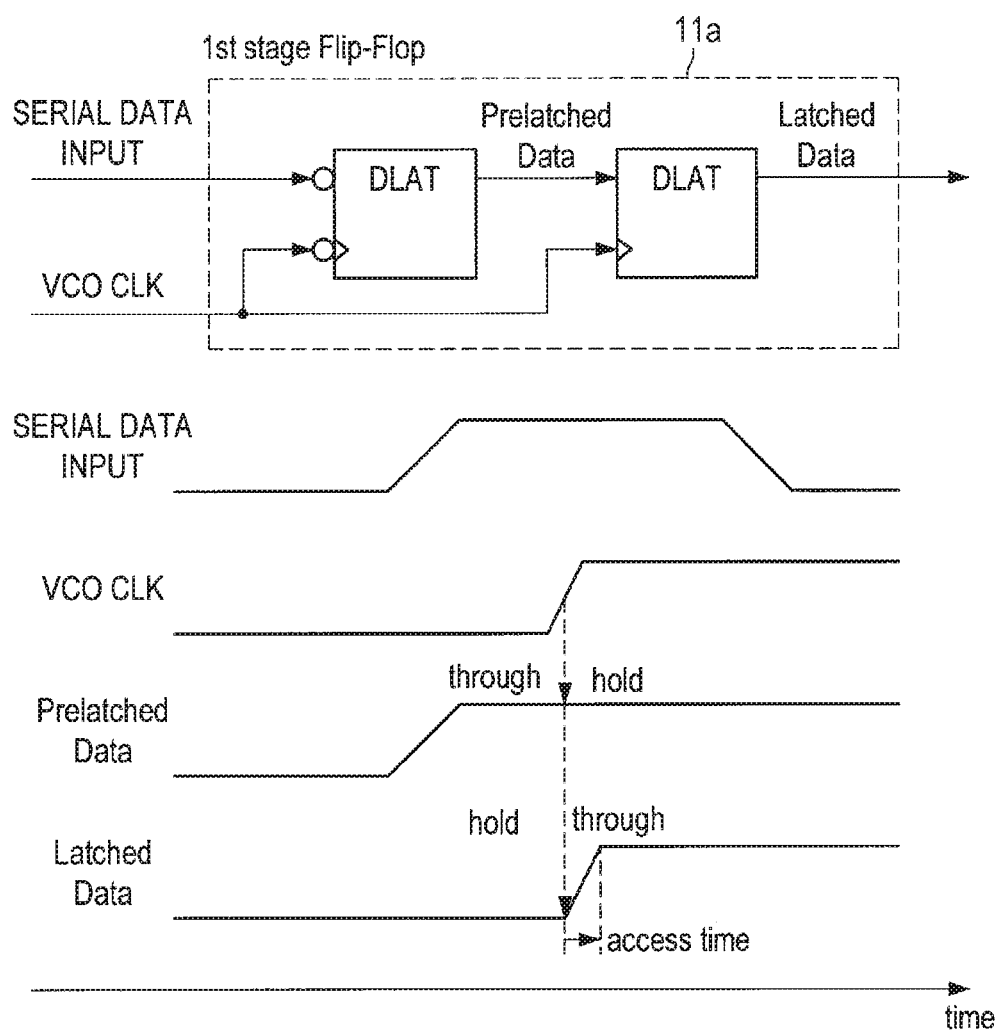
FIG. 2 is an explanatory diagram illustrating a configuration and an operation timing of a D-type flip-flop.

FIG. 2 is an explanatory diagram illustrating a configuration and an operation timing of the D-type flip-flop 11a in the first stage. The D-type flip-flop includes two stages of D latch circuits as illustrated in FIG. 2. Data output by the first-stage D latch circuit when the clock is low is taken in and output by the second-stage D latch circuit at a timing when the clock transitions to high. The time from a rising edge of the clock to the output of data is called an access time.

Figure 3:
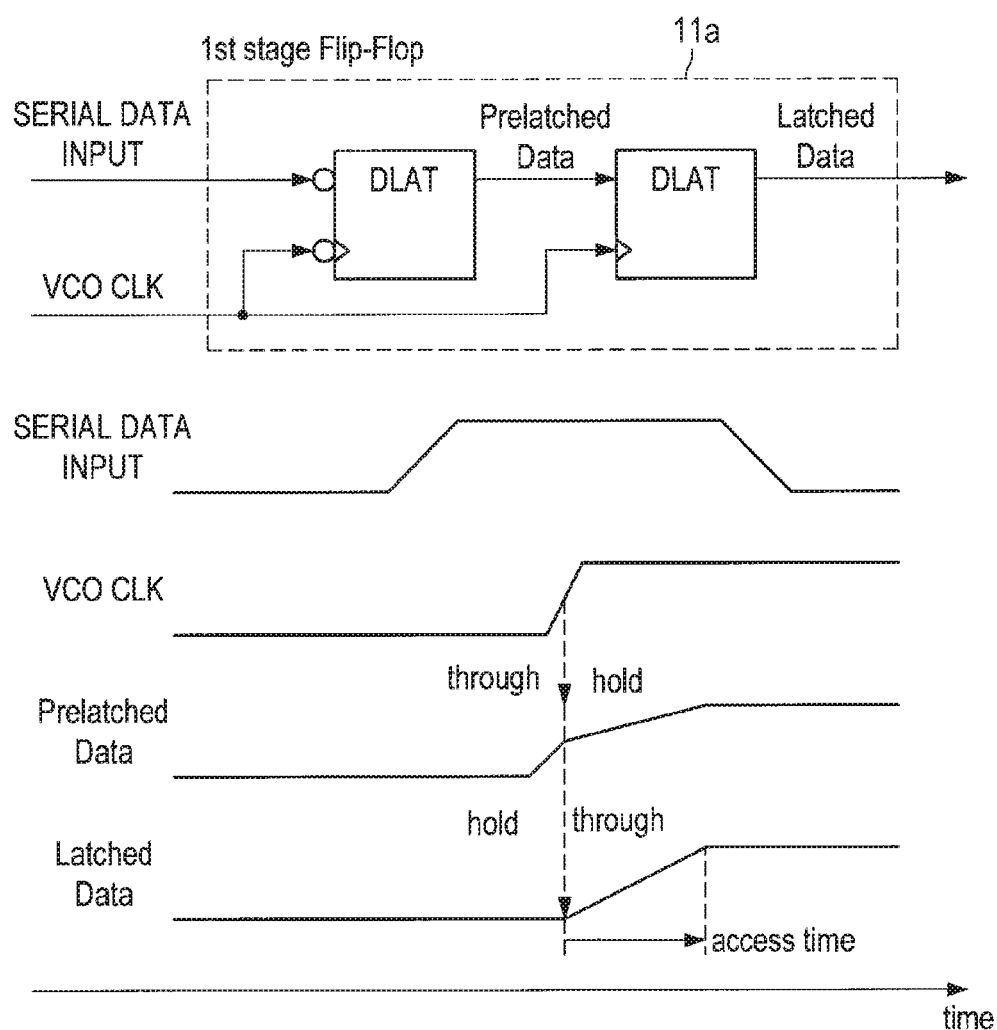
FIG. 3 is an explanatory diagram illustrating a configuration and an operation timing of a D-type flip-flop.

There will be described an example of a behavior in a case where a data transition occurs near a clock transition in such a flip-flop circuit. FIG. 3 is an explanatory diagram illustrating the configuration and operation timing of the D-type flip-flop, and illustrates the behavior of the D-type flip-flop in a case where a data transition occurs near a clock transition. In a case where timings of the clock transition and the data transition are close, the latch transitions to a hold state before the transition of the signal latched by the first-stage D latch circuit is completely finished. Since the latch of the first-stage D latch circuit is incomplete, the driving power of the second-stage D latch circuit is insufficient. Therefore, if the data transition occurs near the clock transition, the access time increases significantly.

The flip-flop circuit in the first stage of the serial reception circuit has a structure that detects a phase shift by detecting a delay of the signal before and after the latch using the XOR circuit. Therefore, the shift of the access time directly becomes a phase error of the serial reception circuit, which leads to degradation in the reception performance of the serial reception circuit. Thus, it is required to make the small setup/hold area as small as possible with respect to the transmission data rate.

This point restricts the upper limit of the operating speed of the serial reception circuit and deteriorates the jitter tolerance. Moreover, the use of a high-speed circuit for the first-stage flip-flop circuit leads to an increase in power consumption.

Thus, in view of the above points, the party disclosing the present disclosure has eagerly studied a technique that aims to improve communication quality by improving the operating speed, reducing the power consumption, and the like in a data reception device that receives serial data. Consequently, as described later, the party disclosing the present disclosure has invented a technique that can improve communication quality by improving the operating speed, reducing the power consumption, and the like in the data reception device that receives serial data.

The overview of the present embodiment has been described above. Next, an example of a configuration of a serial data reception device according to the present embodiment will be described.

[1.2. Configuration Example]

Figure 4:
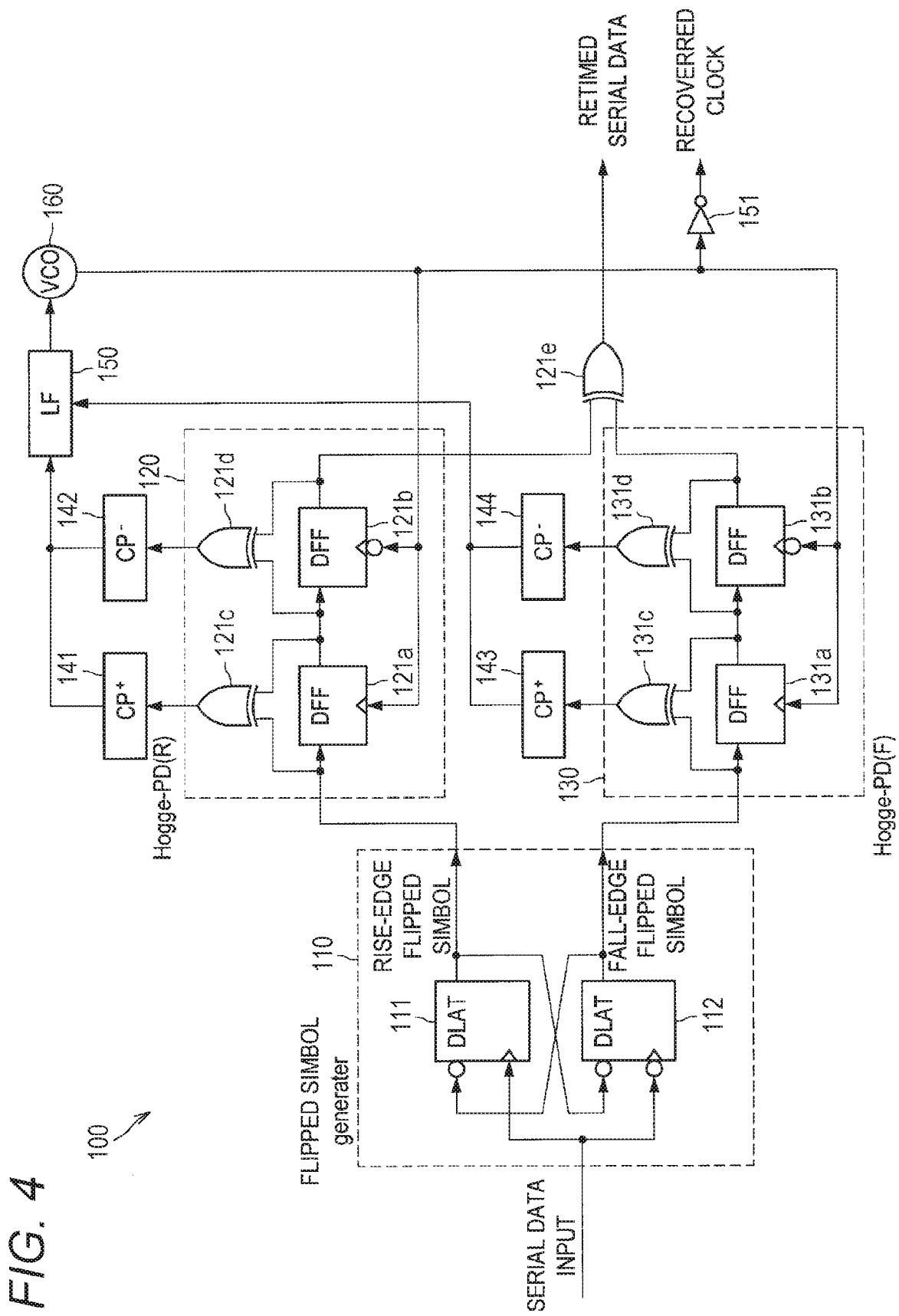
FIG. 4 is an explanatory diagram illustrating an example of a configuration of a serial data reception device 100 according to a first embodiment of the present disclosure.

FIG. 4 is an explanatory diagram illustrating an example of a configuration of a serial data reception device 100 according to the present embodiment. Hereinafter, an example of a configuration of the serial data reception device 100 according to the present embodiment will be described with reference to FIG. 4. The serial data reception device 100 illustrated in FIG. 4 is a device used in a system that transmits and receives digital video/audio data using serial data transmission technology, for example. As the digital video/audio data, for example, the serial data reception device 100 receives a moving image such as a 24-bit Video Graphics Array (VGA), Wide VGA (WVGA), Super VGA (SVGA), eXtended Graphics Array (XGA), Wide XGA (WXGA), Super XGA (SXGA), Ultra XGA (UXGA), and the like.

As illustrated in FIG. 4, the serial data reception device 100 according to the present embodiment includes a flipped symbol generator 110, Hogge phase detectors 120 and 130, charge pumps 141, 142, 143, and 144, a loop filter (LF) 150, and a voltage controlled oscillator (VCO) 160.

Figure 5:
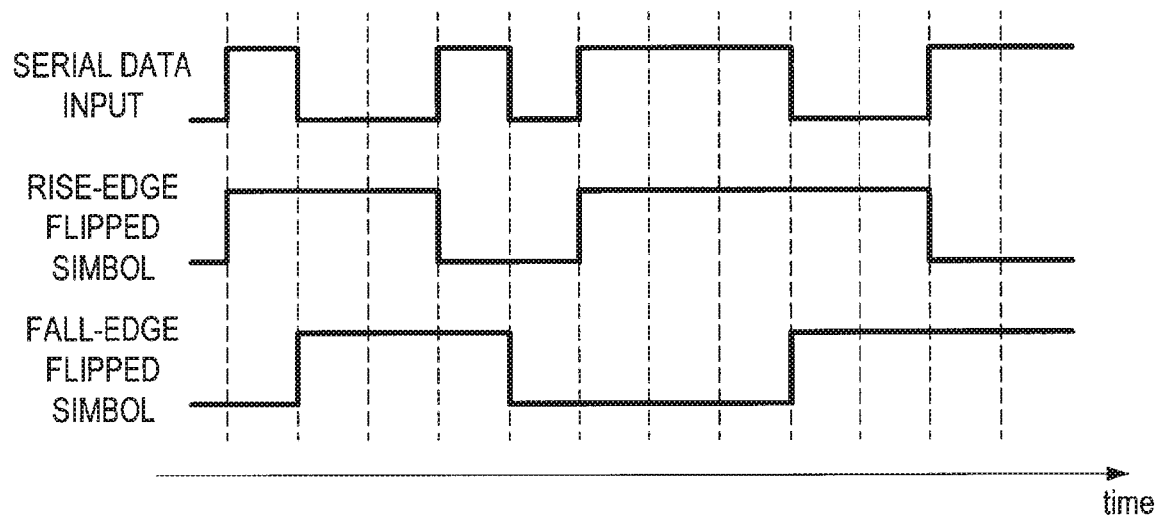
FIG. 5 is an explanatory diagram for explaining a function of a flipped symbol generator 110.

The flipped symbol generator 110 includes D latch circuits 111 and 112. The flipped symbol generator 110 generates and outputs two kinds of signals from serial data being input. One is a signal with "0" and "1" flipped at the time of rising of the serial data, and the other is a signal with "0" and "1" flipped at the time of falling of the serial data. The former will be called a rise-edge fipped simbol, and the latter will be called a fall-edge fipped simbol. FIG. 5 is an explanatory diagram for explaining a function of the flipped symbol generator 110. FIG. 5 illustrates an example of the serial data input to the flipped symbol generator 110 as well as the rise-edge fipped simbol and fall-edge fipped simbol generated from the serial data by the flipped symbol generator 110.

Figure 6:
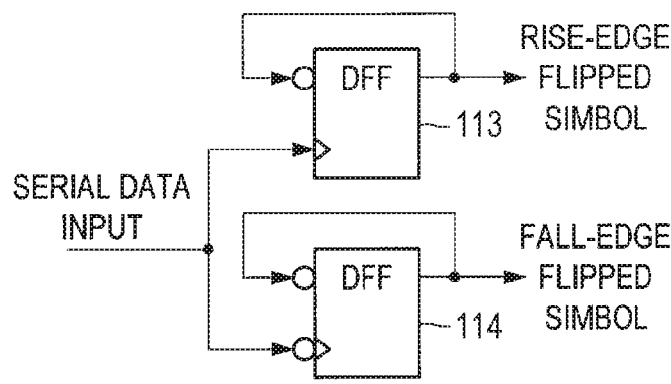
FIG. 6 is an explanatory diagram illustrating an example of a configuration of the flipped symbol generator 110.

FIG. 6 is an explanatory diagram illustrating an example of a configuration of the flipped symbol generator 110. The flipped symbol generator 110 can be realized by including D-type flip-flop circuits 113 and 114 as illustrated in FIG. 6. In other words, the flipped symbol generator 110 illustrated in FIG. 6 is configured by combining two 1/2 frequency dividers that treat the input serial data as a clock. In this case, the operating clock rate of the D-type flip-flop circuits 113 and 114 is half the bit rate of the serial data. Moreover, the D-type flip-flop circuits 113 and 114 each need only take in an inverted signal of the signal that is output therefrom, so that a margin for setup/hold is always secured. Therefore, both an operating clock request and a setup/hold request for the D-type flip-flop circuits 113 and 114 can be greatly relaxed.

Figure 7:
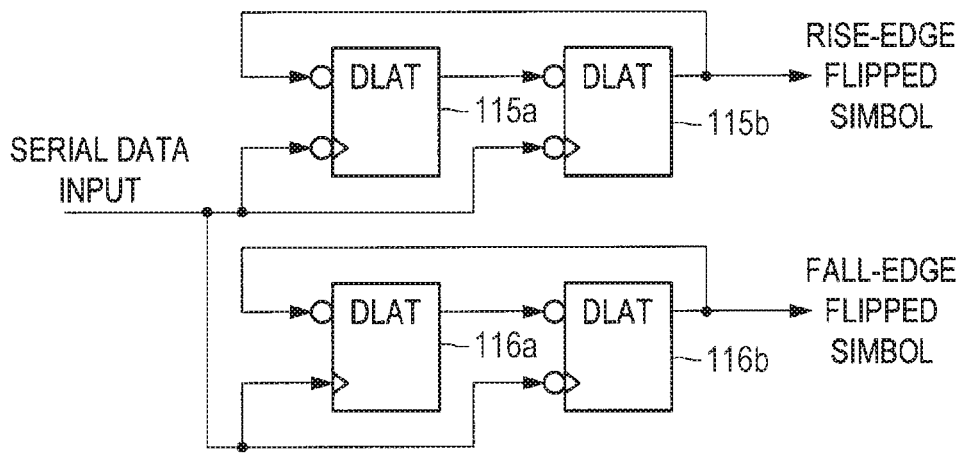
FIG. 7 is an explanatory diagram illustrating an example of a configuration of the flipped symbol generator 110.
Figure 8:
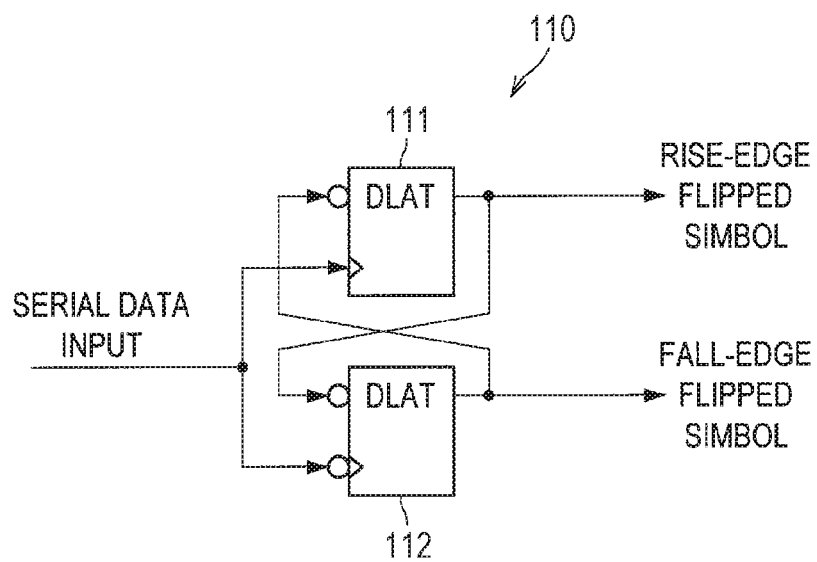
FIG. 8 is an explanatory diagram illustrating an example of a configuration of the flipped symbol generator 110.

Each of the D-type flip-flop circuits 113 and 114 includes two D latch circuits. FIG. 7 is an explanatory diagram illustrating an example of a configuration of the flipped symbol generator 110. The configuration in FIG. 7 is obtained by replacing the flipped symbol generator 110 illustrated in FIG. 6 with D latch circuits 115a, 115b, 116a, and 116b. The D latch circuits 115a and 116a, and the D latch circuits 115b and 116b in the circuit of FIG. 7 can be put together as they operate in the same way. FIG. 8 is an explanatory diagram illustrating an example of a configuration of the flipped symbol generator 110. The configuration in FIG. 8 is obtained by replacing the flipped symbol generator 110 illustrated in FIG. 7 with D latch circuits 111 and 112.

The serial data reception device 100 according to the present embodiment is provided with the flipped symbol generator 110 to be able to generate the rise-edge fipped simbol and the fall-edge fipped simbol from the input serial data. These signals have a characteristic that the minimum value of the number of successive symbols of a bit being "1" or "0" is two. Therefore, when an exclusive OR of these signals is taken, either an original signal or a signal obtained by inverting 0/1 of the original signal can be obtained. Whether the signal is inverted or not depends on an initial state latched by the D latch circuits 111 and 112 and an initial value of the input serial data. Therefore, if it is desired to fix the polarity of the signal, a reset release circuit may be used to release the reset of the D latch circuits 111 and 112 of the flipped symbol generator 110 at the timing when the input serial data is high or low.

The Hogge phase detectors 120 and 130 each detect a phase difference between the input data and the clock. The Hogge phase detector 120 includes a first D-type flip-flop (DFF) 121a of a rising edge type, a second D-type flip-flop 121b of a falling edge type, a first exclusive OR circuit (EXOR) 121c that detects a logical inconsistency between the serial data being input and output of the first DFF 121a, and a second EXOR 121d that detects a logical inconsistency between the output of the first DFF 121a and output of the second DFF 121b.

Similarly, the Hogge phase detector 130 includes a third D-type flip-flop (DFF) 131a of a rising edge type, a fourth D-type flip-flop 131b of a falling edge type, a third exclusive OR circuit (EXOR) 131c that detects a logical inconsistency between the serial data being input and output of the third DFF 131a, and a fourth EXOR 131d that detects a logical inconsistency between the output of the third DFF 131a and output of the fourth DFF 131b.

Figure 9:
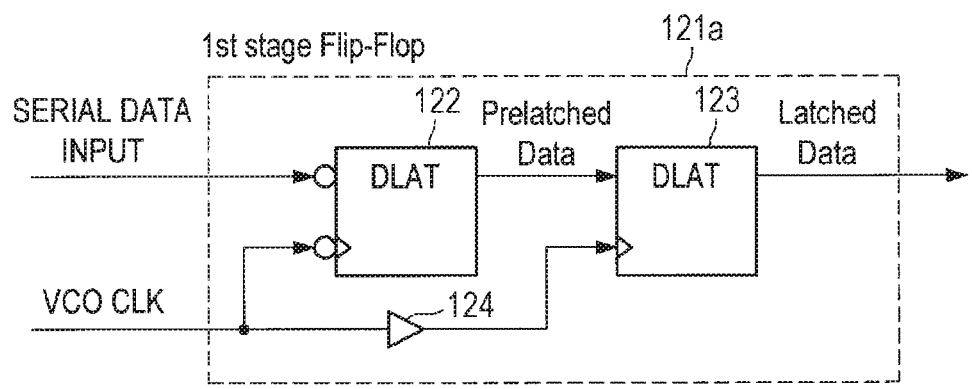
FIG. 9 is an explanatory diagram illustrating a circuit configuration of a D-type flip-flop of a Hogge phase detector 120 according to the same embodiment.

Each of the D-type flip-flops of the Hogge phase detectors 120 and 130 according to the present embodiment has a characteristic that a delay is inserted between D latch circuits of the first stage D-type flip-flop circuit. FIG. 9 is an explanatory diagram illustrating a circuit configuration of the D-type flip-flop of the Hogge phase detector 120 according to the present embodiment. FIG. 9 illustrates only the D-type flip-flop of the Hogge phase detector 120 according to the present embodiment, but the similar applies to the D-type flip-flop of the Hogge phase detector 130. As illustrated in FIG. 9, the D-type flip-flop 121a of the Hogge phase detector 120 according to the present embodiment includes D latch circuits 122 and 123 and a delay element 124.

Figure 10:
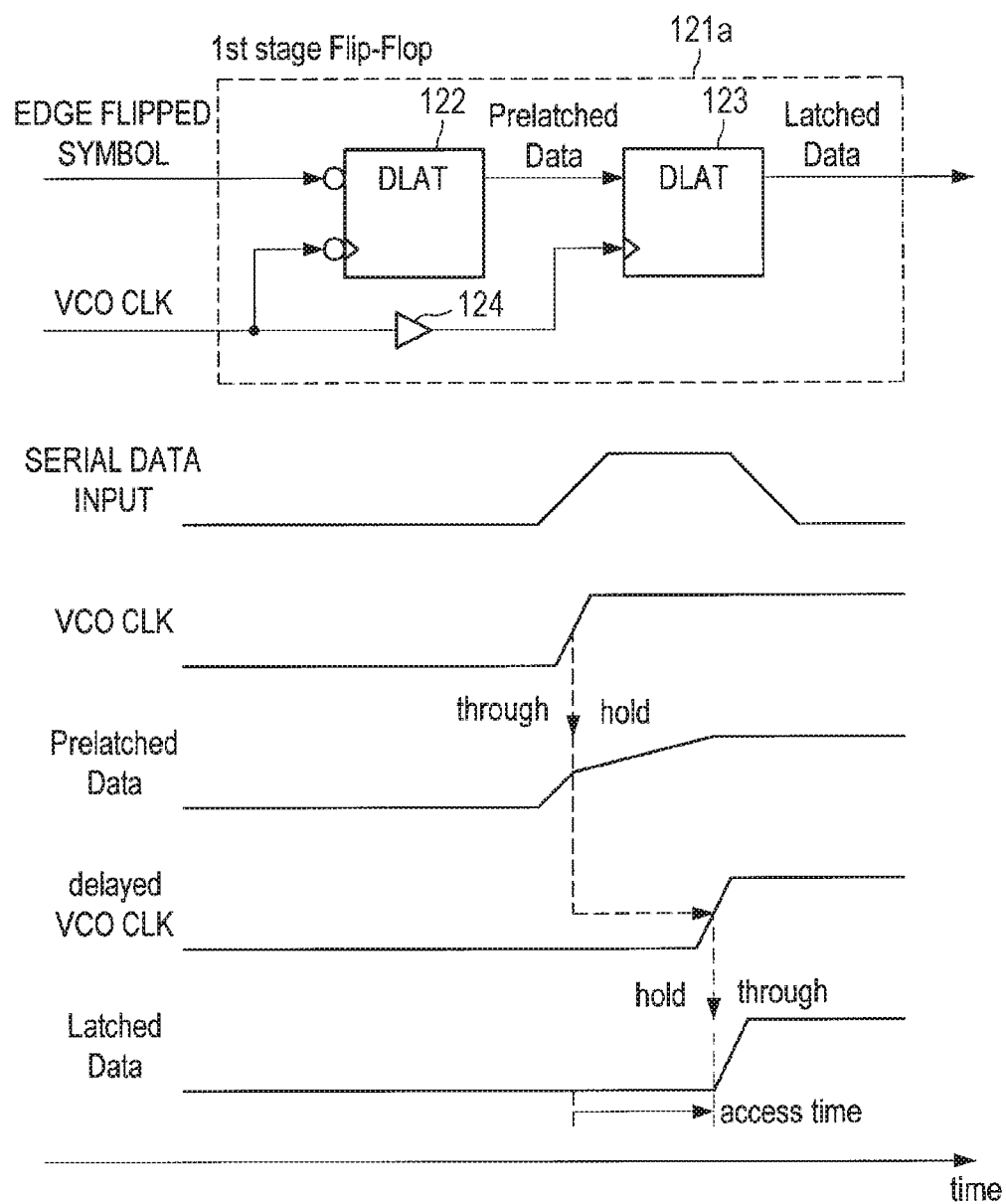
FIG. 10 is an explanatory diagram illustrating an example of data transition of the Hogge phase detector 120 according to the same embodiment.

FIG. 10 is an explanatory diagram illustrating an example of data transition of the Hogge phase detector 120 according to the present embodiment. Even in a case where the data transition timing of the value of the edge fipped simbol is close to the data transition timing of the output of the VCO 160, the delay element 124 delays the output of the VCO 160 transmitted to the D latch circuit 123 by a predetermined time. Therefore, even if the data pre-latched by the D latch circuit 122 enters a hold state, the data latched by the D latch circuit 123 does not enter a hold state immediately but enters the hold state after the predetermined time of delay by the delay element 124. The Hogge phase detectors 120 and 130 according to the present embodiment have the delay element 124 and thus can start the operation after the input of the D latch circuit 123 on the output side is stabilized and can obtain a stable access timing, even in a case where the input clock and the data transition timing are close.

In the Hogge phase detector 120 according to the present embodiment illustrated in FIG. 9, if the input serial data transitions every clock like bit 0, bit 1, and bit 0, for example, the second-stage D latch circuit 122 picks up the second transition due to the insertion of the delay element 123 so that an expected operation cannot be performed. However, in the present embodiment, the flipped symbol generator 110 generates a signal having the characteristic that the minimum value of the number of successive symbols of a bit being "1" or "0" is two. Thus, the Hogge phase detector 120 according to the present embodiment can perform an expected operation with the signal generated by the flipped symbol generator 110.

Output of the first EXOR 121c drives the charge pump (CP+) 141 that charges a current to the LF 150 as an up signal UP, and output of the second EXOR 121d drives the charge pump (CP−) 142 that discharges a current from the LF 150 as a down signal DOWN.

Also, output of the third EXOR 131c drives the charge pump (CP+) 143 that charges a current to the LF 150 as an up signal UP, and output of the fourth EXOR 131d drives the charge pump (CP−) 144 that discharges a current from the LF 150 as a down signal DOWN.

The LF 150 integrates and smooths a charge pump output current to generate an input signal to the VCO 160. The VCO 160 generates a clock having a frequency corresponding to the input signal. The clock generated by the VCO 160 becomes a recovered clock of the serial data reception device 100 through an inverter 151. Furthermore, by taking an exclusive OR of retimed signal data output from the phase detectors 120 and 130 by a fifth EXOR 121e, input data or an inverted signal of the input data can be obtained. Whether the retimed data is inverted or not does not change once the lock is complete. Thus, whether the signal is inverted or not can be determined by inserting a unique pattern in the signal that indicates whether or not the signal is inverted, and a correction can be made by a subsequent logic.

Figure 11:
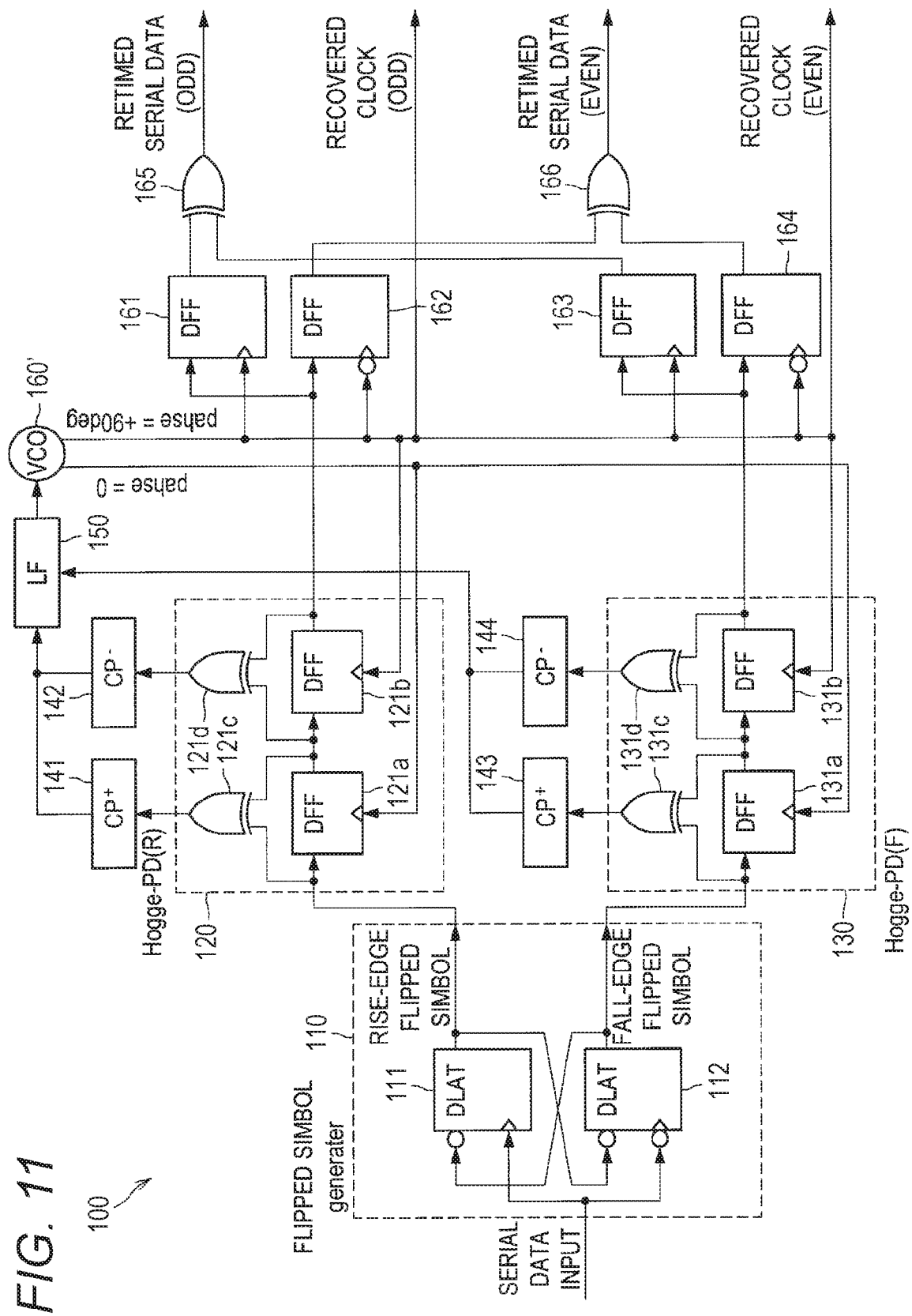
FIG. 11 is an explanatory diagram illustrating a variation of the serial data reception device 100 according to the same embodiment.

A variation of the serial data reception device 100 according to the present embodiment will be illustrated. FIG. 11 is an explanatory diagram illustrating a variation of the serial data reception device 100 according to the present embodiment. In the serial data reception device 100 illustrated in FIG. 11, the D-type flip-flop circuits used in the Hogge phase detectors 120 and 130 are all rising edge types. Also, the serial data reception device 100 illustrated in FIG. 11 has a configuration in which a VCO 160' is provided instead of the VCO 160 illustrated in FIG. 4. Moreover, the serial data reception device 100 illustrated in FIG. 11 further includes D-type flip-flop circuits 161, 162, 163, and 164 and exclusive OR circuits (EXORs) 165 and 166.

In the serial data reception device 100 illustrated in FIG. 11, the D-type flip-flop circuits used in the Hogge phase detectors 120 and 130 are all rising edge types so that the clock frequency of the VCO 160' is half the clock frequency of the VCO 160. With the clock frequency of the VCO 160' being half the clock frequency of the VCO 160, the serial data reception device 100 illustrated in FIG. 11 further reduces power consumption compared to that of the serial data reception device 100 illustrated in FIG. 4. Note that although the clock frequency of the VCO 160' is half the clock frequency of the VCO 160, a two-phase clock shifted by 90 degrees is required. The VCO 160' supplies clocks whose phases are shifted by 90 degrees to the first D-type flip-flop 121a and the second D-type flip-flop 121b, respectively. The similar applies to the first D-type flip-flop 121c and the second D-type flip-flop 121d.

The D-type flip-flop circuits 161 and 162 alternately latch output of the Hogge phase detector 120. For example, the D-type flip-flop circuit 161 latches odd-numbered output of the Hogge phase detector 120, and the D-type flip-flop circuit 162 latches even-numbered output of the Hogge phase detector 120. Similarly, the D-type flip-flop circuits 163 and 164 alternately latch output of the Hogge phase detector 130. For example, the D-type flip-flop circuit 163 latches odd-numbered output of the Hogge phase detector 130, and the D-type flip-flop circuit 164 latches even-numbered output of the Hogge phase detector 130.

The EXOR 165 outputs retimed serial data of the odd-numbered data by taking an exclusive OR of the outputs of the D-type flip-flop circuits 161 and 163. The EXOR 166 outputs retimed serial data of the odd-numbered data by taking an exclusive OR of the outputs of the D-type flip-flop circuits 162 and 164. The serial data reception device 100 illustrated in FIG. 11 has such a configuration and thus need not drive the EXORs 165 and 166 at the data rate, and can contribute to further speed up.

Figure 12:
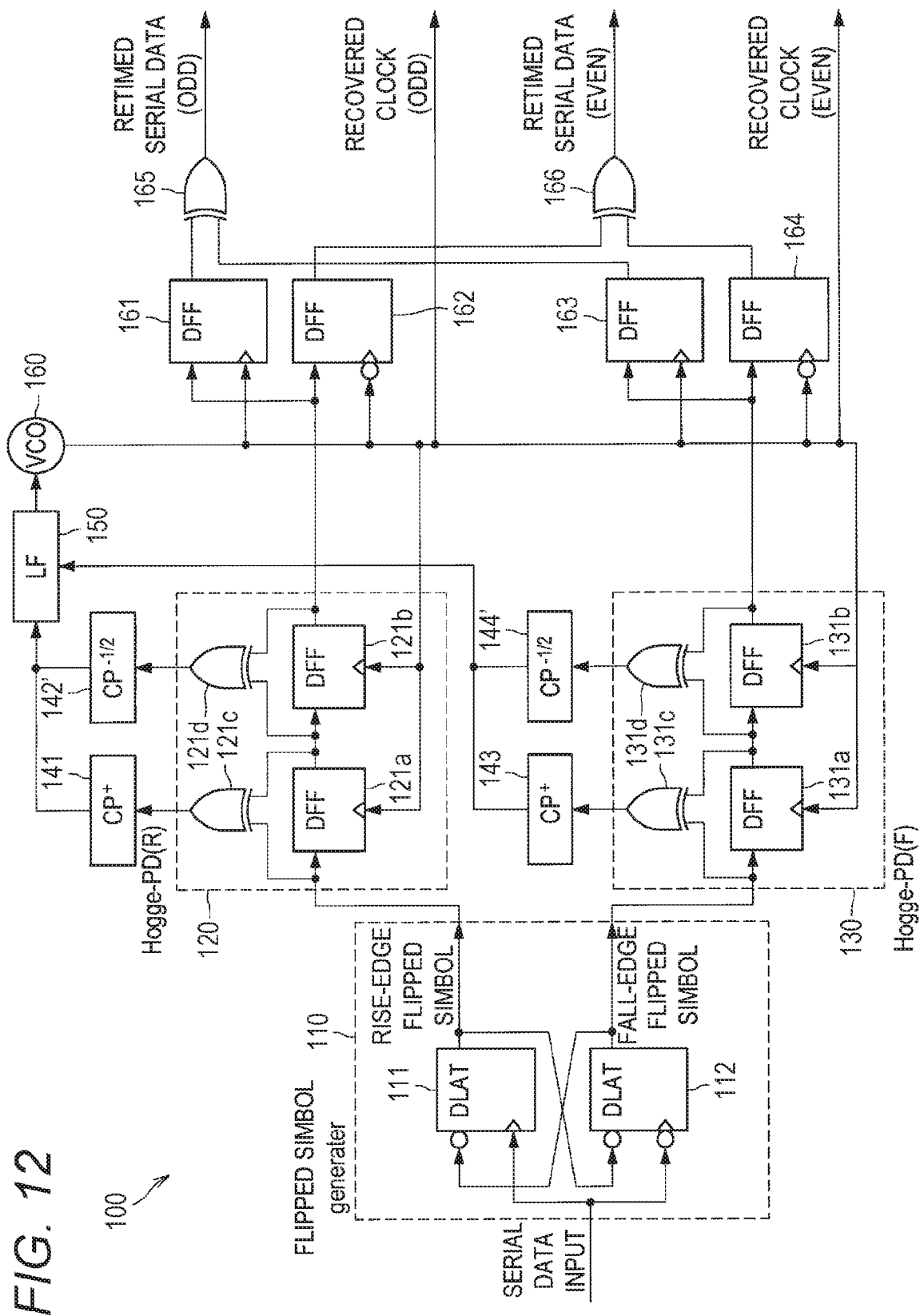
FIG. 12 is an explanatory diagram illustrating a variation of the serial data reception device 100 according to the same embodiment.

A variation of the serial data reception device 100 according to the present embodiment will be illustrated. FIG. 12 is an explanatory diagram illustrating a variation of the serial data reception device 100 according to the present embodiment. In the serial data reception device 100 illustrated in FIG. 12, the D-type flip-flop circuits used in the Hogge phase detectors 120 and 130 are all rising edge types. Moreover, the serial data reception device 100 illustrated in FIG. 11 includes the VCO 160 illustrated in FIG. 4 that outputs a single-phase clock. Also, in the serial data reception device 100 illustrated in FIG. 12, the driving power of charge pumps (CP−) 142' and 144' that discharge a current from the LF 150 is half the driving power of the charge pumps (CP−) 142 and 144.

Thus, the power consumption of the VCO 160 can be further reduced by reducing the driving power of the charge pumps (CP−) 142' and 144' to half the driving power of the charge pumps (CP−) 142 and 144. Accordingly, the serial data reception device 100 illustrated in FIG. 12 can receive serial data while further reducing power consumption.

Figure 13:
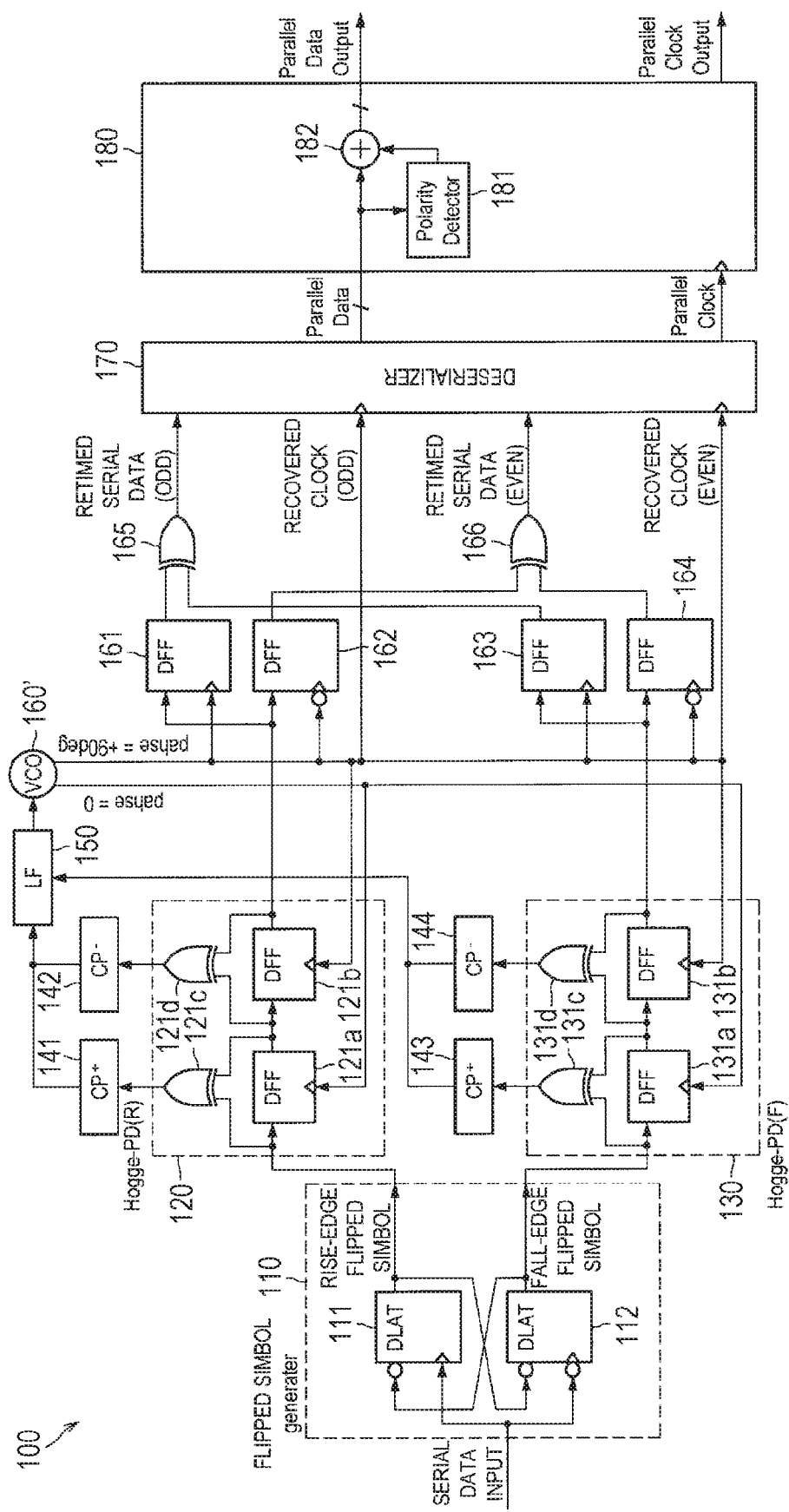
FIG. 13 is an explanatory diagram illustrating an example of an overall configuration of the serial data reception device 100 according to the same embodiment.

An example of an overall configuration of the serial data reception device 100 according to the present embodiment will be illustrated. FIG. 13 is an explanatory diagram illustrating an example of an overall configuration of the serial data reception device 100 according to the present embodiment. The example of the overall configuration of the serial data reception device 100 according to the present embodiment illustrated in FIG. 13 is obtained by adding a deserializer 170 and a polarity detection unit 180 to the configuration illustrated in FIG. 11.

The deserializer 170 converts retimed signal data output from the EXORs 165 and 166 into parallel data having a predetermined bit length and a parallel clock using the clock output from the VCO 160'. The polarity detection unit 180 includes a polarity detector 181 and an adder 182, and detects the polarity using the parallel data and the parallel clock output from the deserializer 170.

As described above, the serial data reception device 100 according to the first embodiment of the present disclosure can perform high-speed operation when receiving the serial data, improves jitter tolerance, and can also reduce power consumption when receiving the serial data.

2. Second Embodiment

[2.1. Overview]

Next, before describing a second embodiment of the present disclosure in detail, an overview leading to the second embodiment of the present disclosure will be described.

Conventionally, a device that performs high-speed data communication using serial transfer has been realized. As such a device, for example, a device that transmits a differential signal using a pair of signal lines has been realized (see, for example, Japanese Patent Application Laid-Open No. 2013-187584, and the like). In this transmission of the differential signal using the pair of signal lines, high-speed data transfer using the differential signal is performed from a device on the transmission side (source device) to a device on the reception side (sink device). Also in this transmission, data transmission from the sink device to the source device is performed by transmission/reception of an in-phase signal via the pair of signal lines through which the differential signal is transmitted. Moreover, in the technique disclosed in Japanese Patent Application Laid-Open No. 2013-187584, a transmission path includes AC coupling so that a device transmitting the differential signal as downstream data and the in-phase signal as upstream data has improved convenience.

On the other hand, in the technique disclosed in Japanese Patent Application Laid-Open No. 2013-187584, the downstream is limited to the differential signal and the upstream is limited to the in-phase signal, where it is assumed that signal separation is performed using the difference between being differential and being in-phase. For this reason, for example, a coaxial cable with which the in-phase signal is transmitted both upstream and downstream cannot be used for the transmission path. Recently, in addition to a differential shielded twisted pair (STP) cable, a coaxial (COAX) cable that is coaxial and inexpensive is increasingly used as the transmission path for data communication. If such a cable cannot be used, the data communication using serial transfer results in limited application. Furthermore, the technique disclosed in Japanese Patent Application Laid-Open No. 2013-187584 requires a charging pattern at the time of starting upstream data and has narrowed the bandwidth of the upstream data.

Thus, in view of the above points, the party disclosing the present disclosure has eagerly studied a technique that can broaden the application by using not only the differential cable but also the coaxial cable and can effectively use the upstream data bandwidth. Consequently, as described below, the party disclosing the present disclosure has invented a technique that can broaden the application by using not only the differential cable but also the coaxial cable and can effectively use the upstream data bandwidth.

The overview of the present embodiment has been described above. Next, an example of a configuration of a serial data transmission/reception system according to the present embodiment will be described.

[2.2. Configuration Example]

Figure 14:
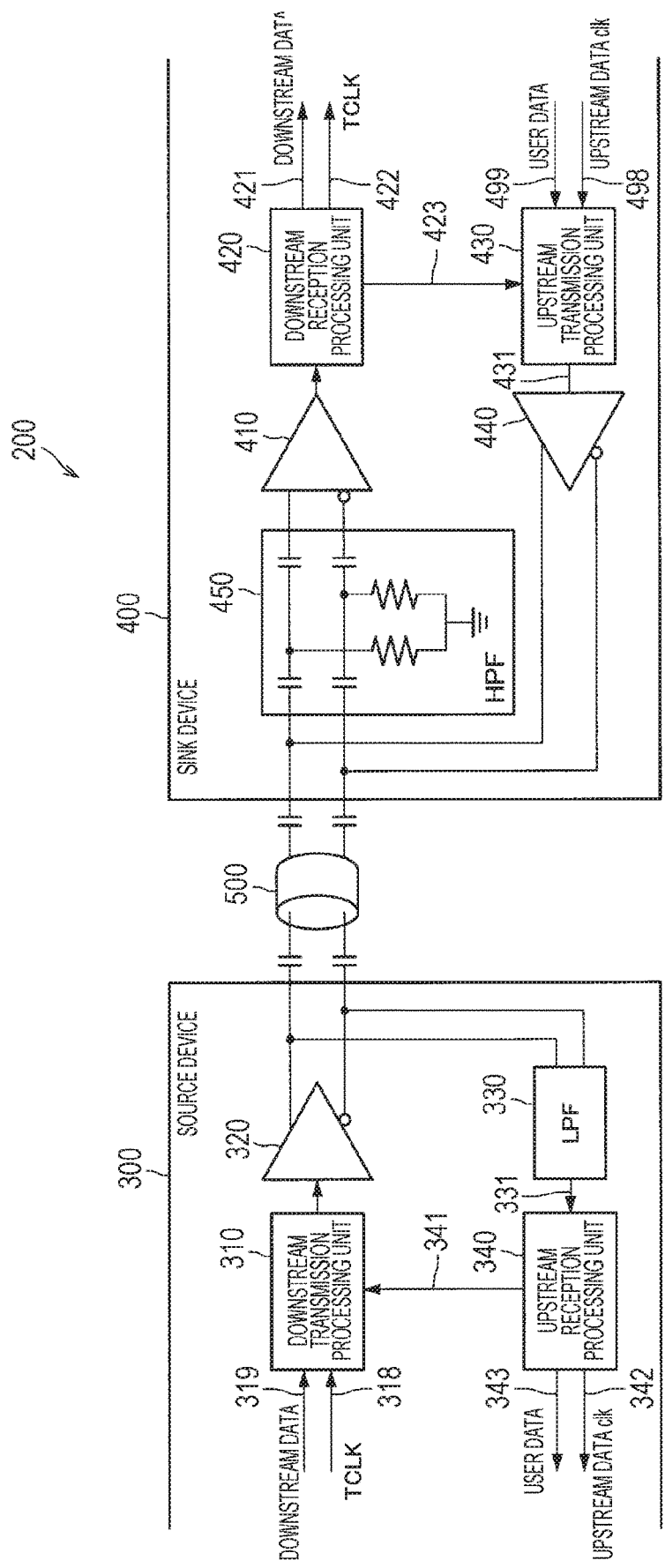
FIG. 14 is an explanatory diagram illustrating an example of a configuration of a serial data transmission/reception system 200 according to a second embodiment of the present disclosure.

FIG. 14 is an explanatory diagram illustrating an example of a configuration of a serial data transmission/reception system 200 according to the second embodiment of the present disclosure. Hereinafter, an example of the configuration of the serial data transmission/reception system 200 according to the second embodiment of the present disclosure will be described with reference to FIG. 14. Note that FIG. 14 illustrates only a functional configuration related to data transmission of a device on the data transmission side (a source device 300) and a device on the data reception side (a sink device 400) of the serial data transmission/reception system 200, and the rest is omitted.

The serial data transmission/reception system 200 according to the second embodiment of the present disclosure is a system that transmits and receives digital video/audio data using serial data transmission technology, for example. The serial data transmission/reception system 200 according to the second embodiment of the present disclosure transmits, as the digital video/audio data, a moving image such as a 24-bit Video Graphics Array (VGA), Wide VGA (WVGA), Super VGA (SVGA), eXtended Graphics Array (XGA), Wide XGA (WXGA), Super XGA (SXGA), Ultra XGA (UXGA), and the like.

As illustrated in FIG. 14, the serial data transmission/reception system 200 according to the second embodiment of the present disclosure includes the source device 300 and the sink device 400. The serial data transmission/reception system 200 performs serial transfer of data by a signal through a pair of signal lines (a transmission path 500), and includes the source device 300, the sink device 400, and the transmission path 500 that is a path of data to be transmitted. The following description assumes that a direction from the source device 300 to the sink device 400 is downstream, and a direction from the sink device 400 to the source device 300 is upstream. The following describes a case where a downstream signal generally handles a video signal and the like, and an upstream signal handles a low-speed signal such as a control signal. A shielded pair cable can be used as the transmission path 500. Here, a differential cable or a coaxial cable may be used for the transmission path 500 connecting the source device 300 and the sink device 400. Therefore, the serial data transmission/reception system 200 can transmit not only a signal being a differential signal downstream and an in-phase signal upstream, but also a signal being an in-phase signal both upstream and downstream.

A configuration of the source device 300 will be described. The source device 300 includes a downstream transmission processing unit 310, a differential driver 320, a low-pass filter (LPF) 330, and an upstream reception processing unit 340.

The downstream transmission processing unit 310 determines data to be transmitted from the source device 300 to the sink device 400, and supplies the data being determined to the differential driver 320. For example, in a case of transmitting data (downstream data) to the sink device 400, the downstream transmission processing unit 310 synchronizes the downstream data with a transmission clock (denoted as "Tclk" in the figure) that is a clock for transmission, and supplies this synchronized downstream data to the differential driver 320. Note that FIG. 14 illustrates a signal line (signal line 319) for supplying the downstream data to the downstream transmission processing unit 310, and a signal line (signal line 318) for supplying the transmission clock TCLK to the downstream transmission processing unit 310. FIG. 14 also illustrates a signal line (signal line 317) for supplying data from the downstream transmission processing unit 310 to the differential driver 320.

Furthermore, in a case where a reference clock transmission command is supplied from the upstream reception processing unit 340 via a signal line 341, the downstream transmission processing unit 310 supplies a clock obtained by dividing the transmission clock TCLK by "N" as a reference clock (REF) to the differential driver 320.

The differential driver 320 generates a differential signal in order to perform serial transfer of the signal supplied from the downstream transmission processing unit 310 through the pair of signal lines (transmission path 500). This differential driver 320 generates a pair of signals (differential signals) having opposite phases to each other, and supplies the signals generated to the sink device 400 via the transmission path 500.

The LPF 330 is a filter that attenuates the signal output from the differential driver 320 and passes a signal transmitted from the sink device 400 through the transmission path 500. FIG. 14 illustrates a signal line (signal line 331) for supplying the signal that has passed through the LPF 330 to the upstream reception processing unit 340. In the present embodiment, the frequency band is changed between the downstream signal transmitted from the source device 300 to the sink device 400 and the upstream signal transmitted from the sink device 400 to the source device 300. Therefore, the LPF 330 has a characteristic of passing the upstream signal transmitted from the sink device 400 to the source device 300 and attenuating the downstream signal transmitted from the source device 300 to the sink device 400.

Figure 15:
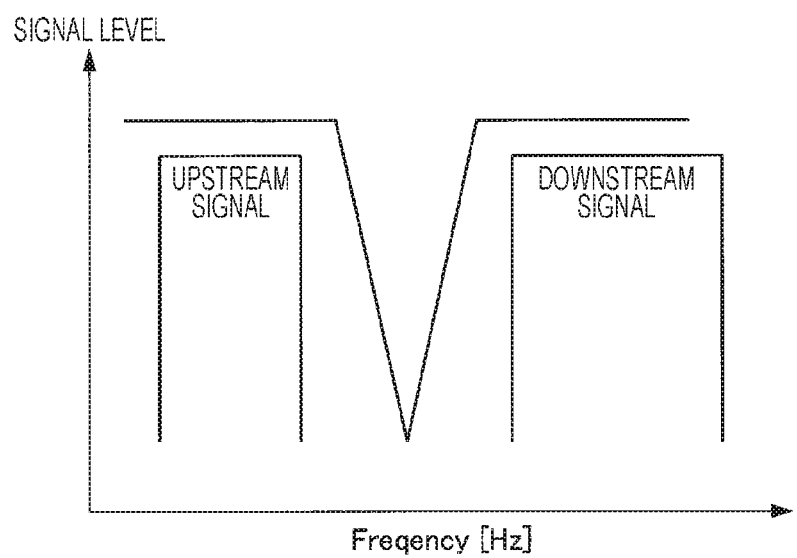
FIG. 15 is an explanatory diagram illustrating an example of frequency components of a downstream signal and an upstream signal in the same embodiment.

FIG. 15 is an explanatory diagram illustrating an example of frequency components of the downstream signal and upstream signal in the present embodiment. As illustrated in FIG. 15, in the present embodiment, the downstream signal and the upstream signal have frequency components such that the frequency bands do not overlap. Note that although the downstream signal has a high frequency and the upstream signal has a low frequency in the present embodiment, the present disclosure is not limited to such an example.

The upstream reception processing unit 340 analyzes the signal that has passed through the LPF 330 and outputs a result of the analysis. For example, in a case where the signal that has passed through the LPF 330 is upstream signal data (herein referred to as user data), the upstream reception processing unit 340 supplies the user data to a circuit (not shown) that uses the user data in the source device 300 via a signal line 343. Also, in a case where the signal that has passed through LPF 330 is a signal requesting a reference clock (herein referred to as a reference clock request signal (REFREQ)), the upstream reception processing unit 340 supplies a reference clock transmission command to the downstream transmission processing unit 310 via the signal line 341. FIG. 14 also illustrates a signal line (signal line 342) for outputting upstream data Clk from the upstream reception processing unit 340.

Although not limited to a specific configuration, for example, the upstream reception processing unit 340 is configured to have a function that compares a signal having passed through the LPF 330 with a reference potential being a predetermined potential, and detects data by comparing a result of the comparison with a predetermined clock generated in the source device 300.

Next, a configuration of the sink device 400 will be described. The sink device 400 includes a differential receiver 410, a downstream reception processing unit 420, an upstream transmission processing unit 430, a differential driver 440, and a high-pass filter (HPF) 450.

The differential receiver 410 receives a differential signal supplied via the transmission path 500 and having passed through the high-pass filter 450. This differential receiver 410 receives the differential signal transmitted by the differential driver 320 of the source device 300 and supplies the received signal to the downstream reception processing unit 420 via a signal line 411.

The downstream reception processing unit 420 analyzes the signal supplied from the differential receiver 410 and outputs a result of the analysis. For example, in a case where downstream data is transmitted as a differential signal, the downstream reception processing unit 420 supplies the downstream data to a circuit (not shown) that uses the downstream data in the sink device 400 via a signal line 421. Also, in a case where a reference clock needs to be received, the downstream reception processing unit 420 supplies a signal for executing transmission of the reference clock request signal (REFREQ) (a reference clock request transmission command) to the upstream transmission processing unit 430 via a signal line 423.

Furthermore, in a case where the reference clock is received, the downstream reception processing unit 420 synchronizes a clock (reference clock) used when the downstream reception processing unit 420 detects downstream data with the reference clock. Note that the downstream reception processing unit 220 supplies the transmission clock (TCLK) to a circuit (not shown) that uses the transmission clock (TCLK) in the sink device 400 via a signal line 422.

Although the configuration of the downstream reception processing unit 420 is not limited to a specific configuration, the configuration of the serial data reception device 100 described in the first embodiment above can be applied as an example of the configuration of the downstream reception processing unit, for example. By applying the configuration of the serial data reception device 100 described above as that of the downstream reception processing unit 420, the sink device 400 can perform high-speed operation when receiving serial data, improve jitter tolerance, and also reduce power consumption when receiving serial data.

The upstream transmission processing unit 430 determines data to be transmitted from the sink device 400 to the source device 300, and supplies the data determined to the differential driver 440. For example, in a case where the reference clock request transmission command is supplied from the downstream reception processing unit 420, the upstream transmission processing unit 430 supplies the reference clock request signal (REFREQ) to the differential driver 440 via the signal line 331.

Also, in a case where data to be transmitted (user data) is supplied without the reference clock request transmission command being supplied, the upstream transmission processing unit 430 supplies the user data to the differential driver 440. In this case, the upstream transmission processing unit 430 synchronizes the user data with an upstream transmission clock (denoted as upstream data Clk in the figure) that is a clock for upstream data transmission, and supplies this synchronized user data to the differential driver 440. Note that FIG. 14 illustrates a signal line 499 for supplying the user data to the upstream transmission processing unit 430, and a signal line 498 for supplying the upstream data Clk to the upstream transmission processing unit 430. Moreover, the upstream transmission processing unit 430 does not prevent transmission of a charging pattern as in the technique disclosed in Japanese Patent Application Laid-Open No. 2013-187584 at the time of starting the upstream data.

The differential driver 440 generates a differential signal in order to transfer the signal supplied from the upstream transmission processing unit 430 through the pair of signal lines (transmission path 500). The differential driver 440 supplies the differential signal generated to the LPF 330 of the source device 300 via the transmission path 500.

The HPF 450 is a filter that attenuates the signal output from the differential driver 440 and passes a signal transmitted from the source device 300 through the transmission path 500. As described above, in the present embodiment, the frequency band is changed between the downstream signal transmitted from the source device 300 to the sink device 400 and the upstream signal transmitted from the sink device 400 to the source device 300. Therefore, the HPF 450 has a characteristic of attenuating the upstream signal transmitted from the sink device 400 to the source device 300 and passing the downstream signal transmitted from the source device 300 to the sink device 400.

The serial data transmission/reception system 200 illustrated in FIG. 14 transmits a video signal by inputting a 24-bit signal or the like in parallel to a pixel clock (which is sometimes called a dot clock or a shift clock) and converting them into a serial signal. In that case, the video signal is a signal multiplied by the pixel clock. In other words, in a case where the resolution is low, the pixel clock is small and the multiplied signal component may also have a low frequency, in which case signals are separated using a high-precision filter if the frequency components between the video signal that is the downstream signal and the upstream signal are close.

Thus, in consideration of such a case, the present embodiment may fix the transmission rate of the downstream signal and transmit the video signal by storing it in the downstream signal. By doing so, the transmission rate of each of the upstream signal and the downstream signal is fixed to be able to have a frequency difference. By having the frequency difference between the upstream signal and the downstream signal, for example, the LPF 330 and the HPF 450 having a simple configuration can be used. The simple configuration refers to one that includes only a resistive element and a capacitive element, and the like, for example, but the present disclosure is, of course, not limited thereto.

Figure 16:
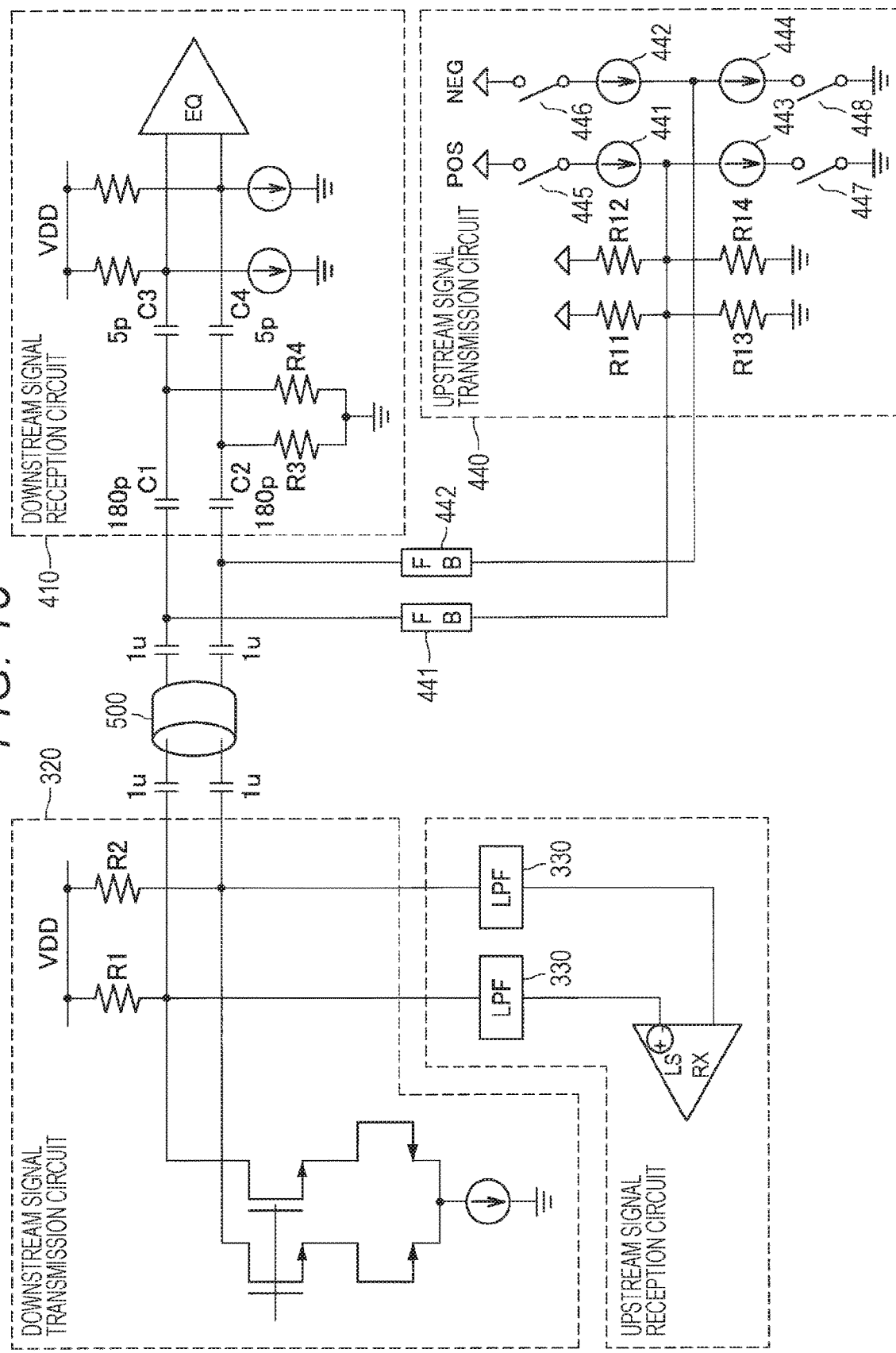
FIG. 16 is an explanatory diagram illustrating an example of a more specific circuit configuration of the serial data transmission/reception system 200 according to the same embodiment.

FIG. 16 is an explanatory diagram illustrating an example of a more specific circuit configuration of the serial data transmission/reception system 200 according to the second embodiment of the present disclosure.

The differential driver 320 (downstream signal transmission circuit) is a differential circuit. The output of the downstream signal transmission circuit is terminated with 50Ω resistors R1 and R2. It is then terminated with 50Ω resistors R3 and R4 in the differential receiver 410 (downstream signal reception circuit) via the transmission path 500. In front of these 50Ω resistors, 180 pF capacitive elements C1 and C2 are placed, for example, which configure a first high-pass filter. Following that, capacitive elements C3 and C4 for cutting a direct current component are also placed, which configure the first high-pass filter. These high-pass filters attenuate the upstream signal transmitted from the sink device 400 to the source device 300.

Ferrite beads (FB) 441 and 442 are provided at a subsequent stage of the differential driver 440 (upstream signal transmission circuit). Ferrite beads (FB) 461 and 462 may be inductor elements. The ferrite beads (FB) 441 and 442 are elements having high impedance at high frequencies and low impedance at low frequencies, and are inserted to reduce the influence of a load on the side of the upstream signal transmission circuit.

The upstream signal transmission circuit has a configuration of a charge pump, and has a configuration in which current from current sources 441, 442, 443, and 444 is output and withdrawn by switching using switches 445, 446, 447, and 448. As described later, for example, Metal-Oxide-Semiconductor Field-Effect Transistors (MOSFETs) can be used as the switches 445, 446, 447, and 448. The upstream signal transmission circuit is also provided with resistive elements R11, R12, R13, and R14 for dividing the power source in order to determine a DC position when currents are cut off. These currents flow through the transmission path 500 to the 50Ω loads of the downstream signal transmission circuit, and the voltage changes.

Since the capacitive elements C3 and C4 each having a low capacitance value are connected on the side of the downstream signal reception circuit, the impedance is high for a low-frequency component so that almost no current flows. Moreover, the downstream signal is input to an upstream signal reception circuit as well, so that an LPF 330 is inserted in a preceding stage to be able to attenuate the downstream signal component and receive only the upstream signal.

The upstream signal reception circuit may further include a DC offset on the side of a positive phase. By including the DC offset on the side of the positive phase, the upstream signal reception circuit can output a high or low level when there is no upstream signal. This DC offset plays a role of preventing the output from being toggled by minute noise or the like when there is no signal. For example, when a high-speed downstream signal is transmitted through the transmission path 500, a reference clock is required at the beginning of a startup sequence in some cases in order to achieve frequency synchronization.

This reference clock request is sent from the side of the sink device 400 using an upstream signal, but in a case where the reference clock request is made when there is no signal and toggling is performed by noise or the like, the reference clock request does not reach the side of the source device 300 so that there is a possibility the synchronization is not achieved and communication fails. As another configuration, there can be another method such as inserting a special code or the like in the upstream signal and determining non-arrival of the code to be the reference clock request, for example, but the addition of the DC offset allows the system to be further simplified.

The switches 445, 446, 447, and 448 are switches that are turned on and off at a predetermined timing. The MOSFETs can be used as such switches, for example. Changing the on/off timing of these switches 445, 446, 447, and 448, that is, changing the on/off timing of the current sources 441, 442, 443, and 444, enables not only differential communication but also in-phase communication and DC-coupled in-phase communication. Also, changing the on/off timing of the switches 445, 446, 447, and 448 can support the transmission path 500 being not only a differential cable but also a coaxial cable.

The duty ratio of the switches 445, 446, 447, and 448 is preferably about 50%. When the duty ratio is a value other than 50%, the voltage of the signal line from the upstream signal transmission circuit approaches a power supply voltage or the ground (GND). When the voltage of the signal line from the upstream signal transmission circuit approaches the power supply voltage or the ground (GND), the current sources 441, 442, 443, and 444 fail.

Note that the circuit constants described above are examples, and it goes without saying that the resistors and capacitors having various circuit constants can be used according to the characteristics of signals that are to be communicated between the source device 300 and the sink device 400 using the transmission path.

Figure 17:
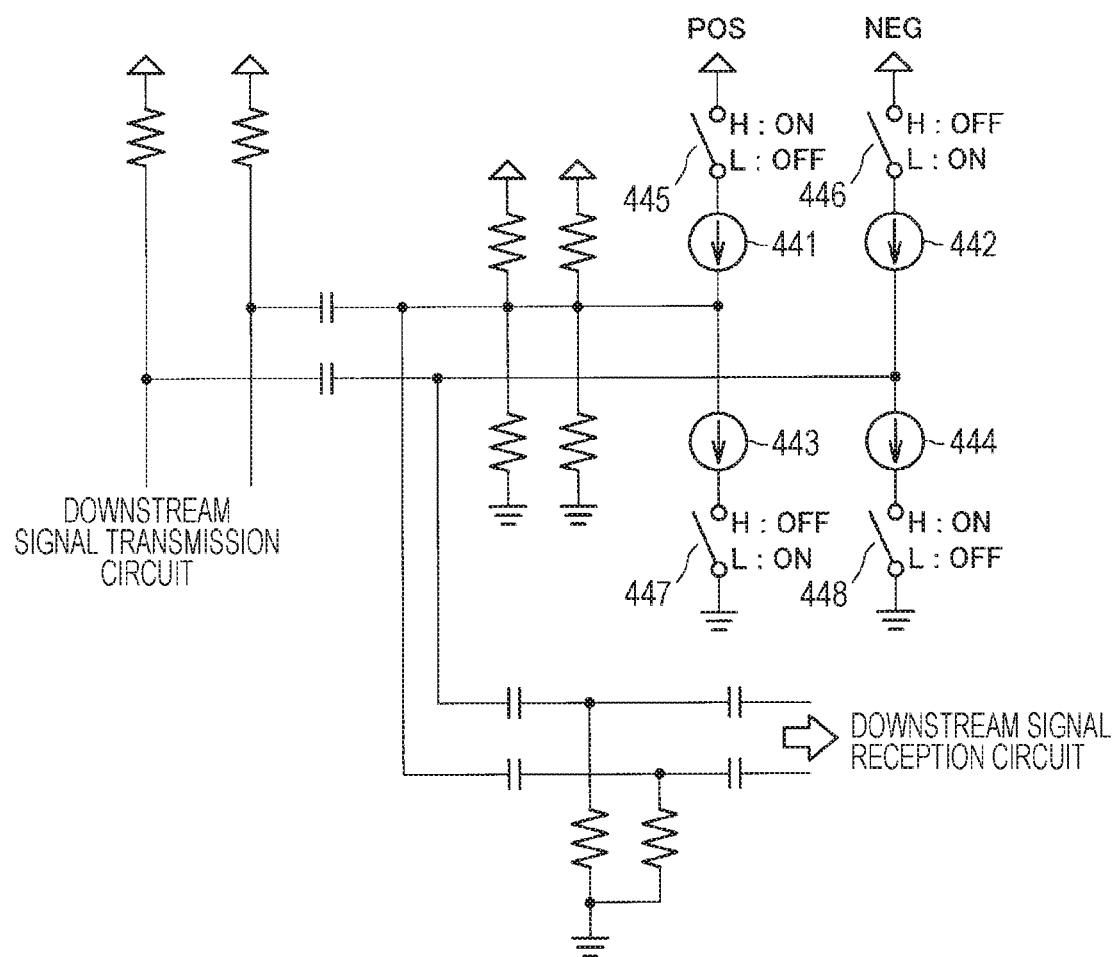
FIG. 17 is an explanatory diagram illustrating an example of a configuration of an upstream signal transmission circuit.
Figure 18:
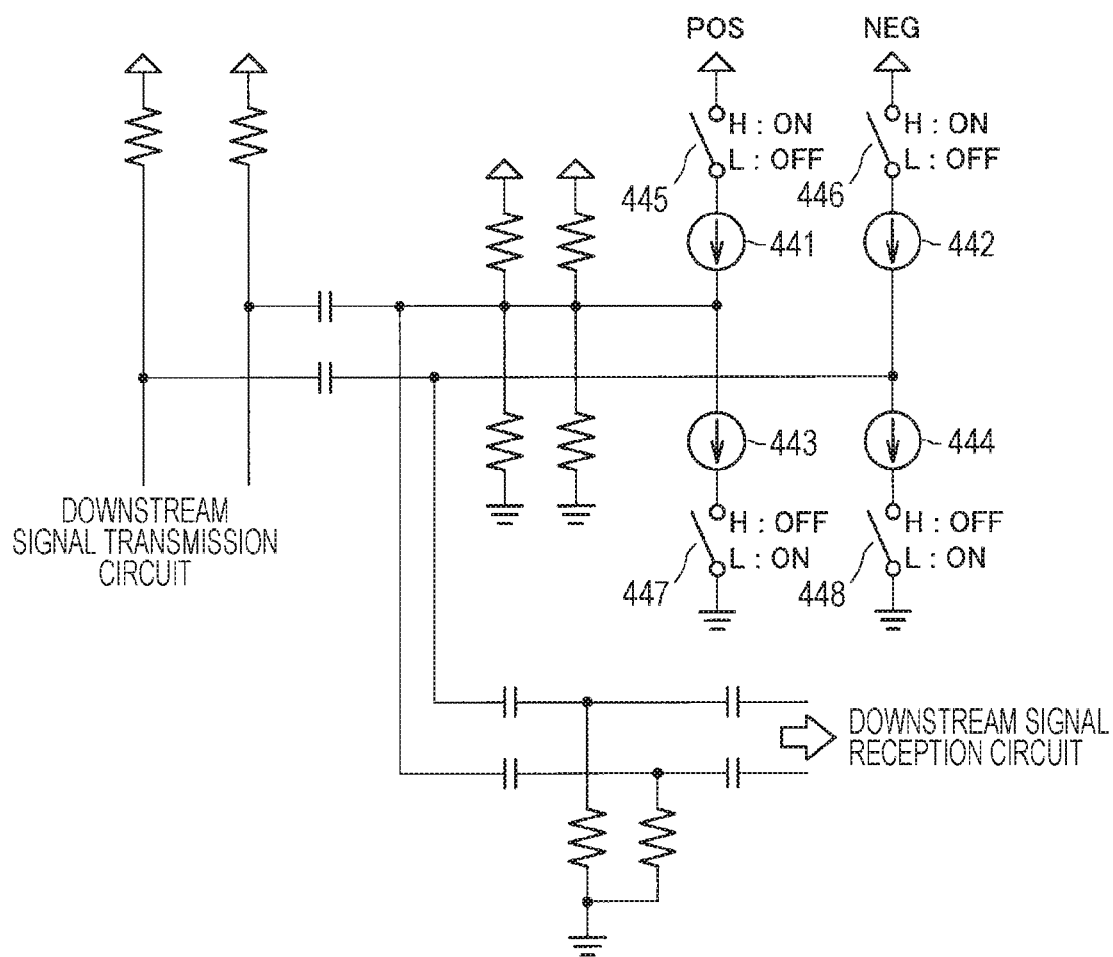
FIG. 18 is an explanatory diagram illustrating an example of a configuration of the upstream signal transmission circuit.
Figure 19:
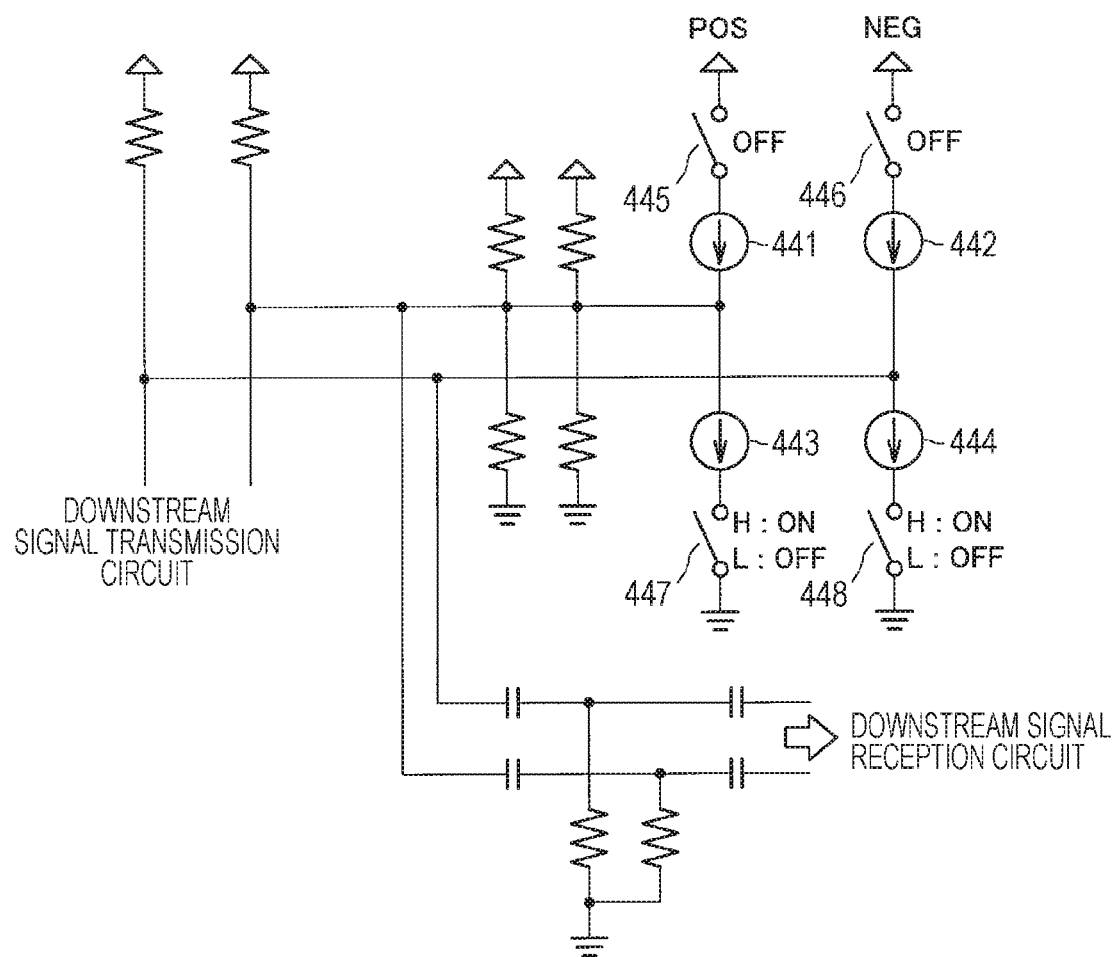
FIG. 19 is an explanatory diagram illustrating an example of a configuration of the upstream signal transmission circuit.
Figure 20:
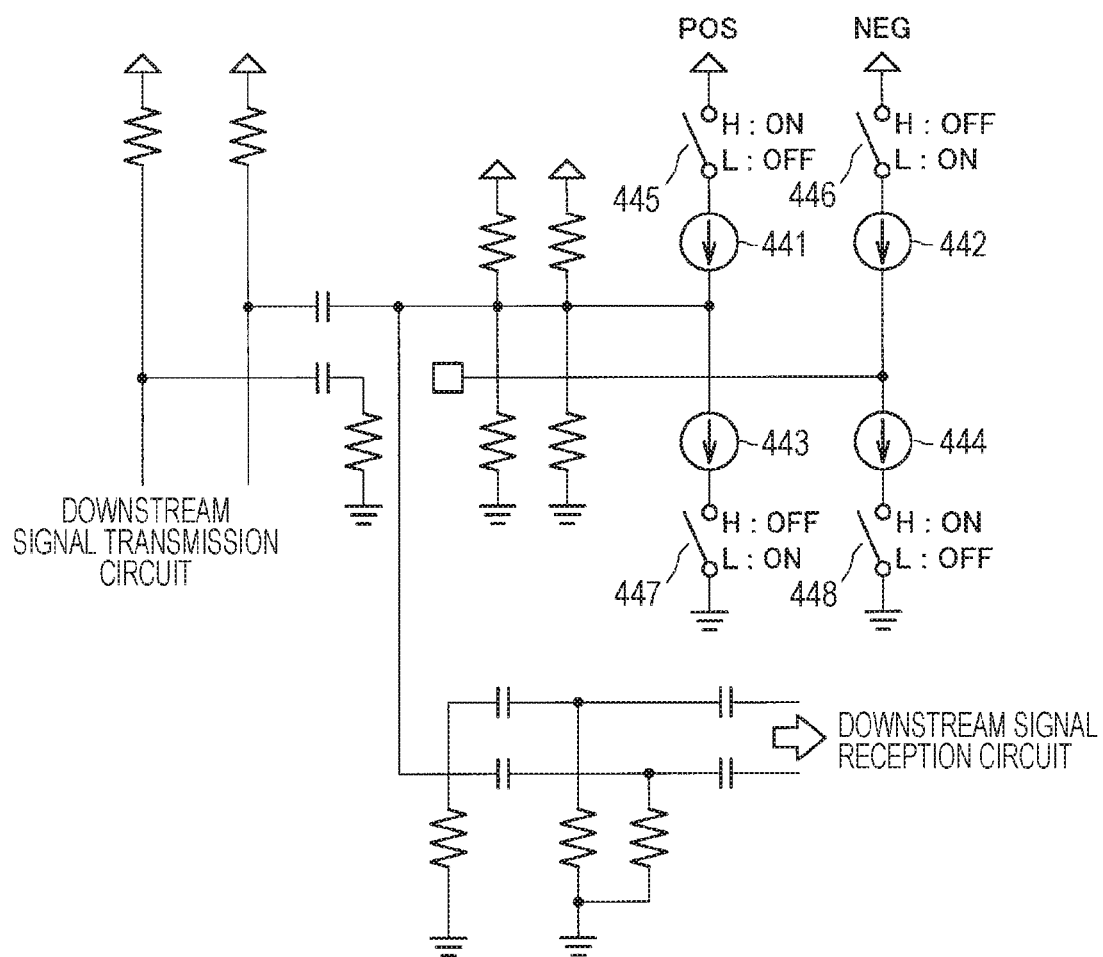
FIG. 20 is an explanatory diagram illustrating an example of a configuration of the upstream signal transmission circuit.

Specific examples of the upstream signal transmission circuit will be illustrated. FIGS. 17 to 20 are explanatory diagrams each illustrating an example of a configuration of the upstream signal transmission circuit. FIG. 17 is an example of a configuration of the upstream signal transmission circuit in a case where AC-coupled differential communication is performed, FIG. 18 is an example of the configuration of the upstream signal transmission circuit in a case where AC-coupled in-phase communication is performed, FIG. 19 is an example of the configuration of the upstream signal transmission circuit in a case where DC-coupled in-phase communication is performed, and FIG. 20 is an example of the configuration of the upstream signal transmission circuit in a case where AC-coupled coaxial communication is performed.

In the upstream signal transmission circuit illustrated in FIG. 17, the switches 445 and 448 are turned on in a high state and turned off in a low state. The switches 446 and 447 are turned on in a low state and turned off in a high state. That is, a differential signal is output from the upstream signal transmission circuit.

In the upstream signal transmission circuit illustrated in FIG. 18, the switches 445 and 446 are turned on in a high state and turned off in a low state. The switches 447 and 448 are turned on in a low state and turned off in a high state. That is, an in-phase signal is output from the upstream signal transmission circuit.

In the upstream signal transmission circuit illustrated in FIG. 19, the switches 445 and 446 are turned off at all times, and the switches 447 and 448 are turned on in a low state and turned off in a high state. That is, an in-phase signal is output from the upstream signal transmission circuit.

In the upstream signal transmission circuit illustrated in FIG. 20, the switches 445 and 448 are turned on in a high state and turned off in a low state. The switches 446 and 447 are turned on in a low state and turned off in a high state. Moreover, coaxial communication is performed in the example illustrated in FIG. 20, so that a signal is transmitted through a single signal line on the transmission path.

The upstream signal transmission circuit can support various transmission paths by changing the on/off characteristics of the switches 445, 446, 447, and 448 as described above according to the signal transmitted through the transmission path 500.

As described above, the serial data transmission/reception system 200 according to the second embodiment of the present disclosure can broaden the application by using not only the differential cable but also the coaxial cable and can effectively use the upstream data bandwidth. Therefore, the serial data transmission/reception system 200 according to the second embodiment of the present disclosure can use various cables as the transmission path 500 to be able to dramatically improve versatility compared to a serial data transmission/reception system that has been able to use only the differential cable for the transmission path.

3. Summary

As described above, the first embodiment of the present disclosure provides the serial data reception device 100 that can improve communication quality by improving the operating speed, reducing the power consumption, and the like in the data reception device that receives serial data.

Moreover, as described above, the second embodiment of the present disclosure provides the serial data transmission/reception system 200 that can broaden the application by using not only the differential cable but also the coaxial cable and can effectively use the upstream data bandwidth.

The preferred embodiments of the present disclosure have been described in detail with reference to the drawings, but the technical scope of the present disclosure is not limited to such examples. Various modifications or alterations will become apparent to those skilled in the art of the present disclosure without departing from the scope of the technical ideas described in the claims, and it is to be understood that these naturally belong to the technical scope of the present disclosure.

Furthermore, the effects described in the present specification are merely illustrative or exemplary, and not restrictive. In other words, the technology according to the present disclosure can exhibit other effects apparent to those skilled in the art from the description of the present specification in addition to or instead of the effects described above.

Note that the following configurations are also within the technical scope of the present disclosure.

(1)

A data reception device including:

a signal generation unit that generates, from serial data received, a first signal whose value is inverted at a rising timing of the serial data and a second signal whose value is inverted at a falling timing of the serial data; and a clock recovery unit that performs clock recovery using the first signal and the second signal generated by the signal generation unit.

(2)

The data reception device according to (1), in which the clock recovery unit includes phase detection units that individually perform phase detection on corresponding ones of the first signal and the second signal.

(3)

The data reception device according to (2), in which each of the phase detection units includes a flip-flop circuit that inputs the first signal or the second signal, and the flip-flop circuit includes a first D latch circuit that inputs the first signal or the second signal and a clock signal, a delay device that delays the clock signal by a predetermined time, and a second D latch circuit that inputs an output of the first D latch circuit and an output of the delay device.

(4)

The data reception device according to (3), in which each of the phase detection units further includes a reset release circuit that releases reset of the first D latch circuit and the second D latch circuit at a timing when a code of the serial data transitions.

(5)

The data reception device according to any one of (2) to (4), further including a charge pump that is driven on the basis of a result of phase detection by each of the phase detection units.

(6)

The data reception device according to (5), further including a loop filter that generates a drive voltage of a voltage controlled oscillator according to an output of the charge pump.

(7)

The data reception device according to any one of (1) to (6), in which the serial data is video data.

(8)

A data transmission/reception device including: a reception circuit that receives a first digital signal from a single transmission path through which the first digital signal and a second digital signal are transmitted, the second digital signal being transmitted in an opposite direction to the first digital signal and having a different frequency band from the first digital signal;

a transmission circuit that transmits the second digital signal; and a filter circuit that attenuates the second digital signal.

(9)

The data transmission/reception device according to (8), in which the transmission circuit transmits the second digital signal that is an in-phase signal with respect to the first digital signal.

(10)

The data transmission/reception device according to (8), in which the transmission circuit transmits the second digital signal that is a differential signal with respect to the first digital signal.

(11)
The data transmission/reception device according to any one of (8) to (10), in which the first digital signal and the second digital signal are transmitted at a fixed transmission rate.

(12)
The data transmission/reception device according to any one of (8) to (11), in which the transmission circuit transmits the second digital signal with a duty ratio of approximately 50%.

(13)
The data transmission/reception device according to (8), in which the transmission circuit transmits a predetermined charging pattern prior to transmission of the second digital signal.

(14)
The data transmission/reception device according to any one of (8) to (13), in which the reception circuit adds a DC component offset to a side of a positive phase.

(15)
The data transmission/reception device according to any one of (8) to (14), in which data transmitted through the transmission path is video data.

(16)
The data transmission/reception device according to (15), in which the data transmission/reception device is a device from which the video data is transmitted.

(17)
The data transmission/reception device according to (15), in which the data transmission/reception device is a device at which the video data is received.

REFERENCE SIGNS LIST

100 Serial data reception device
200 Serial data transmission/reception system
300 Source device
400 Sink device

The invention claimed is:

1. A data reception device, comprising:
   a circuitry configured to receive serial data;
   a signal generation unit configured to generate, based on the received serial data, a first signal whose value is inverted at a rising timing of the serial data and a second signal whose value is inverted at a falling timing of the serial data; and
   a clock recovery unit configured to execute clock recovery operation based on the first signal and the second signal generated by the signal generation unit, wherein the clock recovery unit includes:
      a first phase detection unit configured to execute phase detection on the generated first signal, and
      a second phase detection unit configured to execute phase detection on the generated second signal, wherein
         each of the first phase detection unit and the second phase detection unit includes a flip-flop circuit,
         an input of the flip-flop circuit, of each of the first phase detection unit and the second phase detection unit, is one of the generated first signal or the generated second signal,
         the flip-flop circuit, of each of the first phase detection unit and the second phase detection unit, includes:
            a first D latch circuit, a delay device, and a second D latch circuit, wherein
               an input of the first D latch circuit comprises a clock signal and one of the generated first signal or the generated second signal,
               the delay device configured to delay the clock signal by a specific time, and
               an input of the second D latch circuit comprises an output of the first D latch circuit and an output of the delay device.

2. The data reception device according to claim 1, wherein each of the first phase detection unit and the second phase detection unit further includes a reset release circuit configured to release reset of the first D latch circuit and the second D latch circuit at a timing when a code of the serial data transitions.

3. The data reception device according to claim 1, further comprising a charge pump that is driven based on a result of phase detection by each of the first phase detection unit and the second phase detection unit.

4. The data reception device according to claim 3, further comprising a loop filter configured to generate a drive voltage of a voltage controlled oscillator based on an output of the charge pump.

5. The data reception device according to claim 1, wherein the serial data is video data.

* * * * *